(12) United States Patent
Lee

(10) Patent No.: US 12,166,064 B2
(45) Date of Patent: Dec. 10, 2024

(54) DISPLAY DEVICE

(71) Applicant: Samsung Display Co., LTD., Yongin-si (KR)

(72) Inventor: Tae Hee Lee, Asan-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 532 days.

(21) Appl. No.: 17/350,823

(22) Filed: Jun. 17, 2021

(65) Prior Publication Data

US 2022/0052107 A1    Feb. 17, 2022

(30) Foreign Application Priority Data

Aug. 13, 2020  (KR) .................. 10-2020-0101689

(51) Int. Cl.
*H01L 27/15*    (2006.01)
*H01L 33/38*    (2010.01)
*H01L 33/44*    (2010.01)

(52) U.S. Cl.
CPC ............ *H01L 27/156* (2013.01); *H01L 33/38* (2013.01); *H01L 33/44* (2013.01)

(58) Field of Classification Search
CPC ....... H01L 27/156; H01L 33/38; H01L 33/44; H01L 25/0753; H01L 25/167; H01L 33/62; H01L 33/36
See application file for complete search history.

(56) References Cited

U.S. PATENT DOCUMENTS

| 2018/0175009 A1* | 6/2018 | Kim ................... H01L 25/167 |
| 2018/0175104 A1* | 6/2018 | Kang ................. H01L 33/005 |
| 2019/0115513 A1* | 4/2019 | Im ....................... H01L 33/06 |
| 2019/0181156 A1 | 6/2019 | Kim et al. |

(Continued)

FOREIGN PATENT DOCUMENTS

| JP | 2013-4792 | 1/2013 |
| KR | 10-2020-0034896 | 4/2020 |

(Continued)

OTHER PUBLICATIONS

International Search Report corresponding to International Application No. PCT/KR2021/010682 dated Nov. 26, 2021.

(Continued)

*Primary Examiner* — Su C Kim
(74) *Attorney, Agent, or Firm* — KILE PARK REED & HOUTTEMAN PLLC

(57) ABSTRACT

A display device comprises electrodes spaced apart from one another in a first direction and in a second direction intersecting the first direction, each of the electrodes having a shape extending in the second direction, a first insulating layer disposed on the electrodes, light-emitting elements disposed on the first insulating layer, each of the light-emitting elements including ends disposed on the electrodes spaced apart from one another in the first direction, and a second insulating layer at least partially disposed on the light-emitting elements. The second insulating layer comprises extended portions extending in the second direction, and at least one pattern portion connected to the extended portions. The at least one pattern portion includes a part having a width greater than a width of each of the extended portions in the first direction.

20 Claims, 17 Drawing Sheets

(56) References Cited

U.S. PATENT DOCUMENTS

2019/0244985 A1* 8/2019 Kim .................. H01L 27/124
2021/0376281 A1 12/2021 Kim et al.

FOREIGN PATENT DOCUMENTS

| KR | 10-2020-0077671 | 7/2020 |
| KR | 10-2020-0082434 | 7/2020 |
| KR | 10-2020-0086790 | 7/2020 |

OTHER PUBLICATIONS

Written Opinion corresponding to International Application No. PCT/KR2021/010682 dated Nov. 26, 2021.

* cited by examiner

DISPLAY DEVICE

CROSS REFERENCE TO RELATED APPLICATION(S)

This application claims priority to and benefits of Korean Patent Application No. 10-2020-0101689 under 35 U.S.C. § 119, filed on Aug. 13, 2020 in the Korean Intellectual Property Office, the entire contents of which are incorporated herein by reference.

BACKGROUND

1. Field of the Disclosure

The disclosure relates to a display device.

2. Description of the Related Art

Display devices are becoming increasingly important with the development of multimedia. Various types of display devices such as organic light emitting displays and liquid crystal displays are being used.

A display device is a device for displaying an image and includes a display panel such as an organic light emitting display panel or a liquid crystal display panel. Light emitting display panels may include light emitting elements such as light emitting diodes (LEDs). The LEDs may be organic light emitting diodes (OLEDs) using an organic material as the fluorescent material or may be inorganic LEDs using an inorganic material as the fluorescent material.

SUMMARY

Aspects of the disclosure provide an inorganic light-emitting display device capable of preventing delamination of an insulating layer covering light-emitting elements.

It should be noted that other aspects and objects of the invention will be apparent to those skilled in the art from the following descriptions.

According to an embodiment, even though an insulating layer for fixing the alignment locations of light-emitting elements in a display device has a long length and narrow line width, it is possible to prevent delamination of the insulating layer because the insulating layer includes pattern portions connected thereto.

It should be noted that other effects of the disclosure will be apparent to those skilled in the art from the following descriptions.

According to an embodiment, a display device may include multiple electrodes spaced apart from one another in a first direction and in a second direction intersecting the first direction. Each of the electrodes may have a shape extending in the second direction. A first insulating layer may be disposed on the electrodes. Light-emitting elements may be disposed on the first insulating layer and each of the light-emitting elements may include ends disposed on the electrodes that are spaced apart from one another in the first direction. A second insulating layer may be at least partially disposed on the light-emitting elements. The second insulating layer may include multiple extended portions extending in the second direction and at least one pattern portion connected to the extended portions. The pattern portion may include a part having a width greater than the width of each of the extended portions in the first direction.

A width of each of the extended portions may be smaller than the length of the light-emitting elements in the first direction. The pattern portion may be disposed in a first region between the electrodes spaced apart in the second direction, and a width of the pattern portion may be smaller than the distance between the electrodes spaced apart from each other in the first direction.

The pattern portion may have a shape extending in the first direction and may be disposed on a side of the electrodes where the electrodes spaced apart from one another in the second direction face each other.

The pattern portion may include a first pattern portion disposed to surround a first region between the electrodes spaced apart from each other in the second direction. The length of the part of the first pattern portion extended in the first direction may be greater than the width of the extended portions in the first direction.

The first pattern portion may include a first connection bridge connecting between a center of a part of the first pattern portion extended to a center of another part of the first pattern portion extended in the first direction.

The first insulating layer may include contact holes that are spaced apart from the light-emitting elements in the second direction and expose parts of the electrodes. The pattern portion may include a second pattern portion that surrounds an area in which the contact holes are formed and does not overlap the contact holes.

The second pattern portion may include second connection bridges disposed between the contact holes. Each of the second connection bridges may connect a part of the second pattern portion extending in the first direction to another part of the second pattern portion extending in the first direction. The second connection bridges may be arranged in parallel with the extended portions.

The display device may further include an emission area where the electrodes are disposed, a sub-area located on a side of the emission area in the second direction, and a bank surrounding the emission area and the sub-area. The second insulating layer may include an upper layer disposed on the bank and a connection bridge connecting the upper layer to the first pattern portion.

The electrodes may include a first electrode, a second electrode spaced apart from the first electrode in the first direction, a third electrode disposed between the first electrode and the second electrode, and a fourth electrode spaced apart from the second electrode in the first direction. The light-emitting elements may include a first light-emitting element including ends disposed on the first electrode and the third electrode, respectively, and a second light-emitting element including ends disposed on the second electrode and the fourth electrode, respectively. The extended portions of the second insulating layer may include a first extended portion that overlaps the first light-emitting element, and a second extended portion that overlaps the second light-emitting element.

The electrodes may include a fifth electrode spaced apart from the first electrode in the second direction, a sixth electrode spaced apart from the second electrode in the second direction, a seventh electrode spaced apart from the third electrode in the second direction, and an eighth electrode spaced apart from the fourth electrode in the second direction. The light-emitting elements may include a third light-emitting element including ends disposed on the fifth electrode and the seventh electrode, respectively, and a fourth light-emitting element including ends disposed on the sixth electrode and the eighth electrode, respectively. The extended portions of the second insulating layer include a third extended portion that overlaps the third light-emitting element, and a fourth extended portion that overlaps the fourth light-emitting element.

The pattern portion may comprise a first pattern portion surrounding a first region between the electrodes spaced apart from each other in the second direction and connected to the first to fourth extended portions.

The pattern portion may include a second pattern portion connected to the first extended portion and the second extended portion and spaced apart from the first pattern portion in the second direction, and a third pattern portion connected to the third extended portion and the fourth extended portion and spaced apart from the first pattern portion in the second direction. The second pattern portion and the third pattern portion may not overlap the light-emitting elements.

The display device may include a first contact electrode disposed on the first electrode and contacting the first light-emitting element, a second contact electrode disposed on the second electrode and contacting the second light-emitting element, a third contact electrode disposed on the third electrode and the fifth electrode and contacting the first light-emitting element and the third light-emitting element, a fourth contact electrode disposed on the seventh electrode and the eighth electrode and contacting the third light-emitting element and the fourth light-emitting element, and a fifth contact electrode disposed on the fourth electrode and the sixth electrode and contacting the second light-emitting element and the fourth light-emitting element.

At least a part of each of the first, second third, fourth, and fifth contact electrodes may be disposed on the second insulating layer.

According to an embodiment, a display device may include a first electrode group comprising multiple electrodes spaced apart from one another in a first direction and extending in a second direction intersecting the first direction, a second electrode group comprising multiple electrodes spaced apart from the first electrode group in the second direction and spaced apart from one another in the first direction, a first insulating layer disposed on the electrodes, light-emitting elements disposed on the electrodes spaced apart in the first direction, a second insulating layer at least partially disposed on the light-emitting elements and contact electrodes that contact at least one of the plurality of electrodes and at least one of the light-emitting elements. The second insulating layer may include a plurality of extended portions overlapping the light-emitting elements and extending in the second direction and a pattern portion connected to the extended portions and comprising a part having a width greater than the width of each of the extended portions in the first direction.

The pattern portion may be disposed between the first electrode group and the second electrode group, and the width of the pattern portion may be larger than the width of the extended portions in the first direction but may be smaller than the distance between the electrodes spaced apart from one another in the first direction.

The pattern portion may have a shape extending in the first direction and may be disposed on a side of the electrodes where the electrodes spaced apart from one another in the second direction face each other.

The pattern portion may include a first pattern portion connected to the plurality of extended portions and surrounding a first region between the first electrode group and the second electrode group.

The first insulating layer may include contact holes that are spaced apart from the light-emitting elements in the second direction and expose parts of the electrodes. The pattern portion may include a second pattern portion connected to the plurality of extended portions and disposed to surround the area in which the contact holes are disposed.

The contact electrodes may include first type contact electrodes disposed on one of the electrodes, and second type contact electrodes disposed over two or more of the electrodes.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The embodiments will now be described more fully hereinafter with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when an element is referred to as being "on" another element (or layer, or substrate), it can be directly on the other element, or intervening elements may also be present. The same reference numbers indicate the same components throughout the specification. The phrase "in a plan view" means when an object portion is viewed from above, and the phrase "in a cross-sectional view" means when a cross-section taken by vertically cutting an object portion is viewed from the side. When an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element. In this specification, the first direction DR1 and the second direction DR2 are perpendicular to each other, and the third direction DR3 is a normal direction with respect to a plane defined by the first and second directions DR1 and DR2.

Hereinafter, the embodiments will be described with reference to the accompanying drawings.

Figure 1:
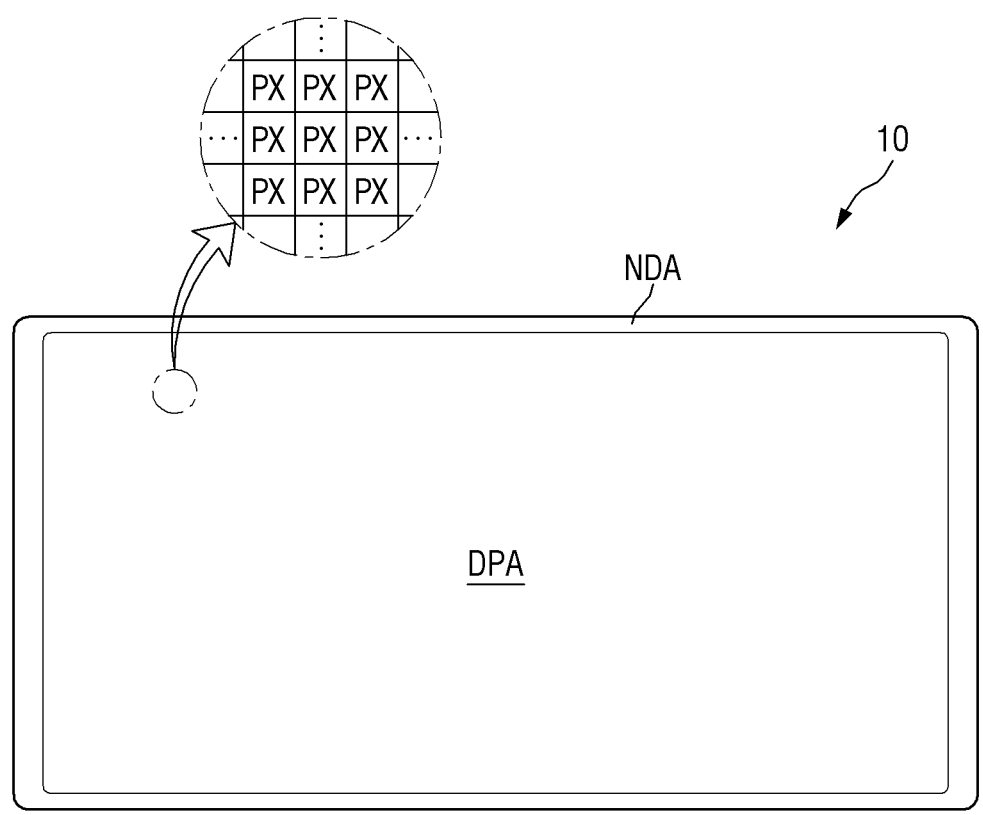
FIG. 1 is a schematic plan view of a display device according to an embodiment.

FIG. 1 is a schematic plan view of a display device according to an embodiment.

Referring to FIG. 1, the display device 10 displays a moving image or a still image. The display device 10 may refer to any electronic device that provides a display screen. For example, the display device 10 may include a television set, a laptop computer, a monitor, an electronic billboard, an Internet of Things (IoT) device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. An inorganic light-emitting diode display panel is used as an example of the display panel 10, but the embodiments are not limited thereto. Any other display panel may be employed as long as the spirit and scope of the invention can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 shows the display device 1 in the shape of a rectangle with longer horizontal sides and the display area DPA.

The display device 10 may include the display area DA and a non-display area NDA. In the display area DPA, images can be displayed. In the non-display areas NDA, images are not displayed. The display area DPA may be referred to as an active area, while the non-display areas NDA may also be referred to as an inactive area. The display area DPA may generally occupy the center of the display device 10.

The display area DPA may include pixels PX. The pixels PX may be arranged in a matrix. The shape of each pixel PX may be, but is not limited to, a rectangle or a square in a plan view. Each pixel may have a diamond shape having sides inclined with respect to a direction. The pixels PX may be arranged in stripes and PenTile® pattern alternately. Each of the pixels PX may include at least one light-emitting element ED that emits light of a particular wavelength band to represent a color.

The non-display areas NDA may be disposed around the display area DPA. The non-display areas NDA may surround the display area DPA entirely or partially. The display area DPA may have a rectangular shape, and the non-display areas NDA may be disposed to be adjacent to the four sides of the display area DPA. The non-display area NDA may form the bezel of the display device 10. Lines or circuit drivers included in the display device 10 may be disposed in each of the non-display areas NDA, or external devices may be mounted.

Figure 2:
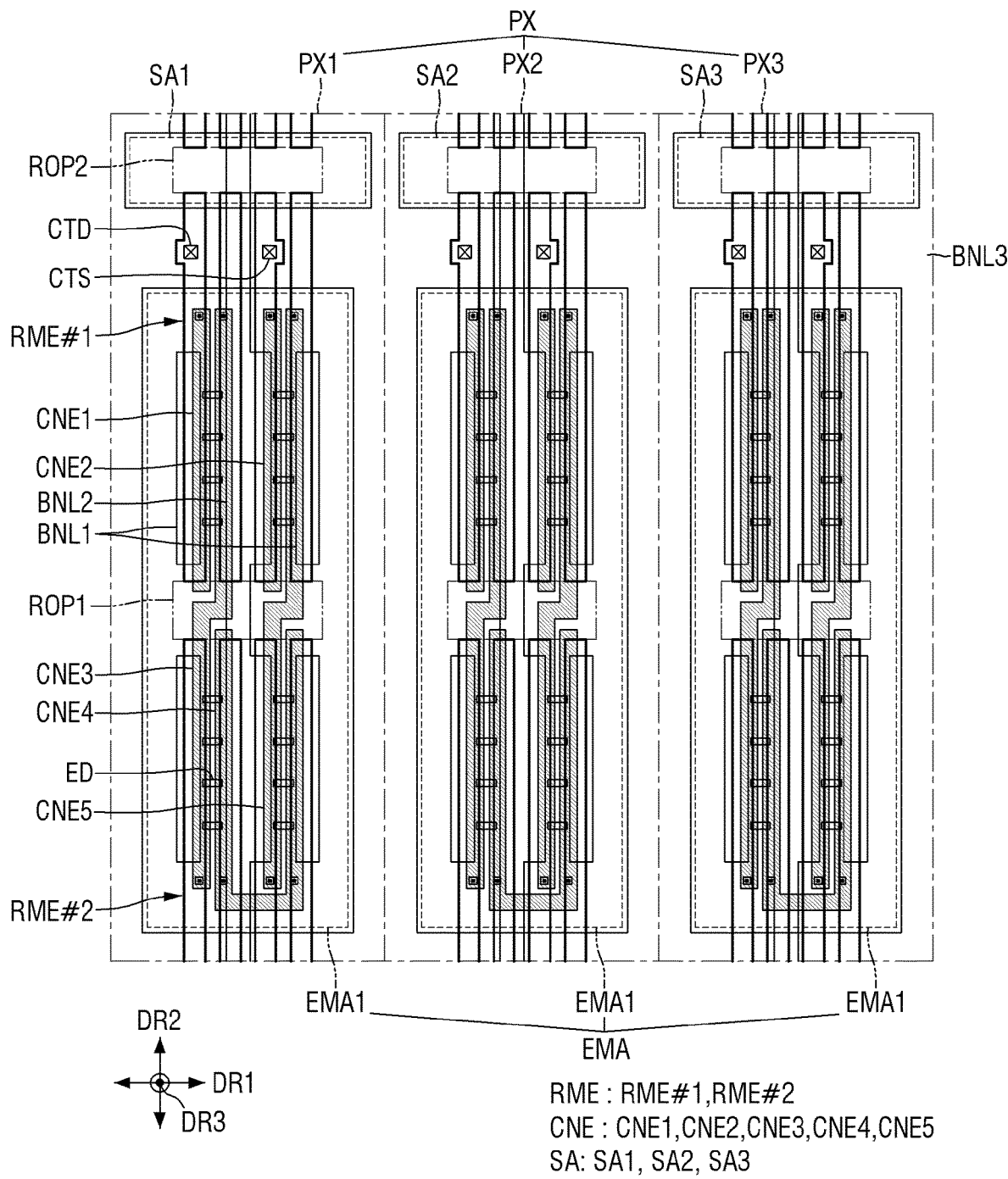
FIG. 2 is a schematic plan view showing a pixel of a display device according to an embodiment.

FIG. 2 is a schematic plan view showing a pixel of a display device according to an embodiment.

Referring to FIG. 2, each of the pixels PX may include sub-pixels PXn, where n is an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. However, the embodiments are not limited thereto. All the sub-pixels PXn may emit light of the same color. Although the pixel PX includes three sub-pixels PXn in the example shown in FIG. 2, the embodiments are not limited thereto. The pixel PX may include more than two sub-pixels PXn.

Every pixel PX of the display device 10 may include emission areas EMA, and each sub-pixel PXn may include an emission area EMA and a non-emission area (not shown). In the emission area EMA, the light-emitting elements ED (refer to FIG. 6) may be disposed to emit light of a particular wavelength. In the non-emission area, light-emitting elements ED may not be disposed and light emitted from the light-emitting elements ED may not reach the non-emission area. Thus, no light may exit from the non-emission area. The emission area may include an area adjacent to the light-emitting elements ED where light emitted from the light-emitting elements ED may exit, in addition to the area in which the light-emitting elements ED are disposed.

The emission area may also include an area in which light emitted from the light-emitting elements ED is reflected or refracted by other elements to exit. The light-emitting elements ED may be disposed in each of the sub-pixels PXn, and the emission area may include the area where the light-emitting elements are disposed and the adjacent area.

A first emission area EMA1 of the pixel PX may be disposed in the first sub-pixel PX1, a second emission area EMA2 may be disposed in the second sub-pixel PX2, and a third emission area EMA3 may be disposed in the third sub-pixel PX3. Each sub-pixel PXn may include different types of light-emitting elements ED, and the first to third emission areas EMA may emit lights of different colors. For example, the first sub-pixel PX1 may emit light of a first color, the second sub-pixel PX2 may emit light of a second color, and the third sub-pixel PX3 may emit light of a third color. The first color may be blue, the second color may be green, and the third color may be red. However, the embodiments are not limited thereto. The sub-pixels PXn may include the same kind of light-emitting elements ED and the emission areas EMA or a single pixel PX may emit light of the same color.

Each of the sub-pixels PXn of the pixel PX may include sub-areas SA spaced apart from the emission area EMA as a part of the non-emission area. The sub-areas SA may include a first sub-area SA1 of the first sub-pixel PX1, a second sub-area SA2 of the second sub-pixel PX2, and a third sub-area SA3 of the third sub-pixel PX3. The sub-area SA may be disposed on a side of the emission area EMA in the second direction DR2 in each of the sub-pixels PXn, and may be disposed between the emission areas EMA of the sub-pixels PXn adjacent to each other in the second direction DR2. For example, in each of the sub-pixels PXn, the sub-area SA may be disposed on the upper side of the emission area EMA in the second direction DR2, and the emission areas EMA of the first to third sub-pixels PX1, PX2 and PX3 may be arranged side-by-side in the first direction DR1. Similarly, the first sub-area SA1, the second sub-area SA2 and the third sub-area SA3 may be arranged side-by-side in the first direction DR1.

Light-emitting elements ED may not be disposed in the sub-areas SA and thus no light may exit from the sub-areas SA. The electrodes RME disposed in each of the sub-pixels PXn may extend into the sub-areas SA. Some (or at least a part) of the electrodes RME disposed in each of the sub-pixels PXn may be separated in the sub-areas SA.

A third bank BNL3 may be disposed in a lattice pattern on the entire surface of the display area DPA including portions extended in the first direction DR1 and the second direction DR2 in a plan view. The third bank BNL3 may be disposed along the border of each of the sub-pixels PXn to distinguish adjacent sub-pixels PXn from one another. The third bank BNL3 may be disposed to surround the emission area EMA and the sub-areas SA disposed in each of the sub-pixels PXn to distinguish them.

Figure 3:
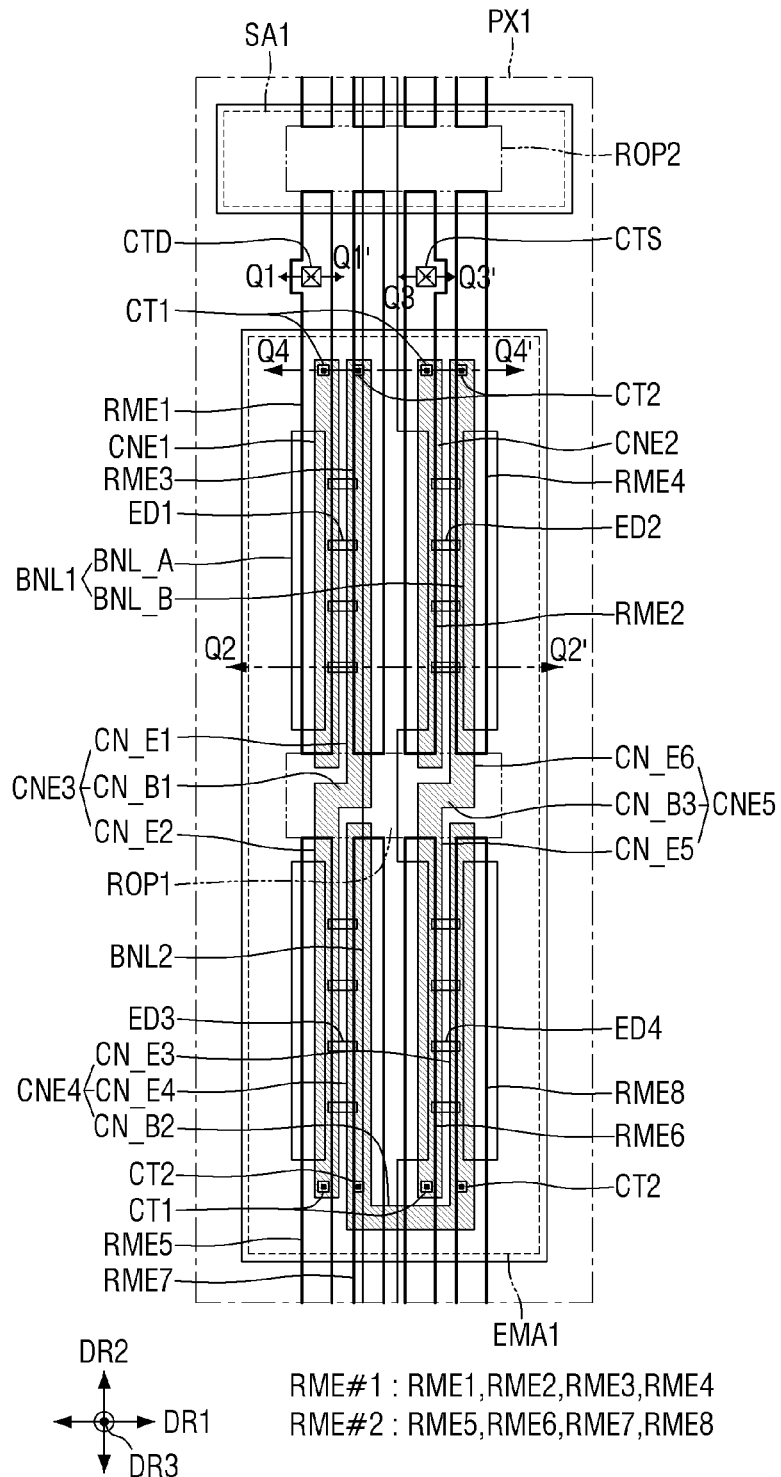
FIG. 3 is a schematic plan view showing a first sub-pixel of FIG. 2.
Figure 4:
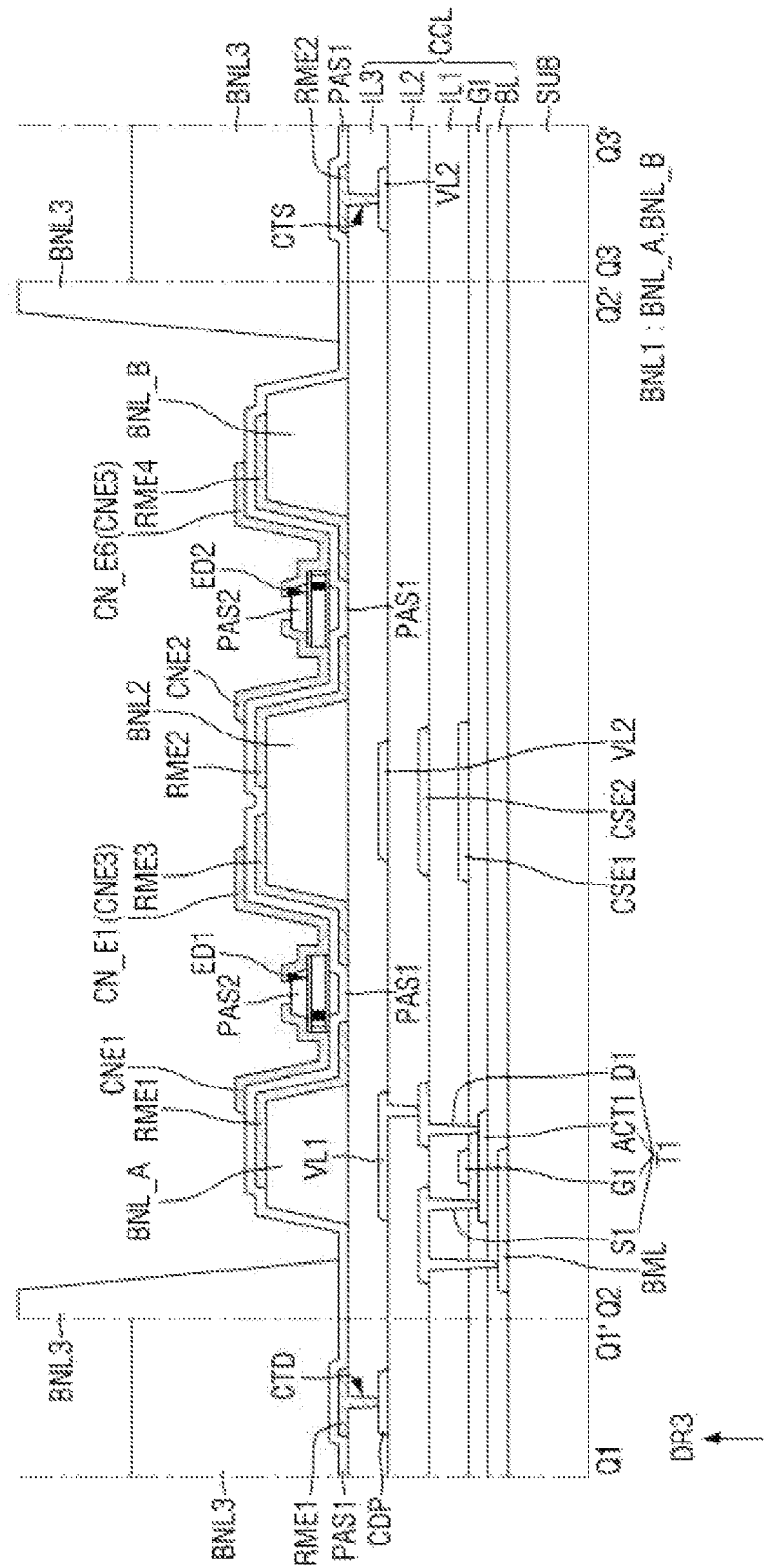
FIG. 4 is a schematic cross-sectional view taken along lines Q1-Q1', Q2-Q2' and Q3-Q3' of FIG. 3.
Figure 5:
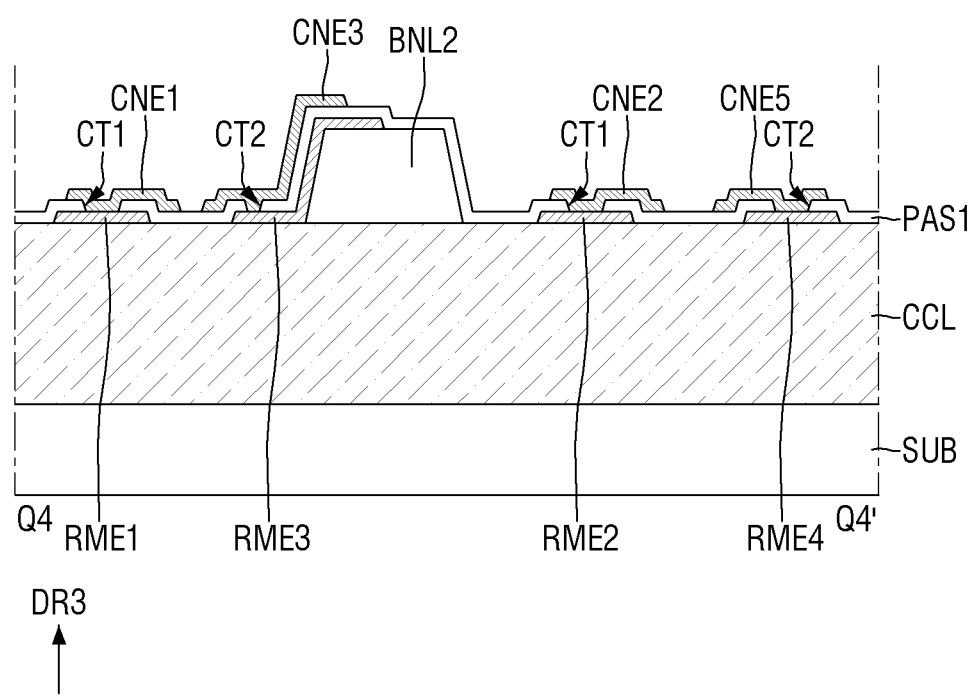
FIG. 5 is a schematic cross-sectional view taken along line Q4-Q4' of FIG. 3.

FIG. 3 is a schematic plan view showing a first sub-pixel of FIG. 2. FIG. 4 is a schematic cross-sectional view taken along lines Q1-Q1', Q2-Q2' and Q3-Q3' of FIG. 3. FIG. 5 is a schematic cross-sectional view taken along line Q4-Q4' of FIG. 3. FIG. 4 is a view showing a cross section from one end to the other end of the light-emitting elements ED disposed in a sub-pixel PXn. FIG. 5 is a view showing a cross section traversing contact holes CT1 and CT2 formed in a sub-pixel PXn.

Referring to FIGS. 3 to 5 in connection with FIG. 2, the display device 10 may include a first substrate SUB, and a circuit layer CCL and a display element layer disposed on the first substrate SUB. In the display element layer, multiple electrodes RME and contact electrodes CNE may be disposed, including the light-emitting elements ED. The circuit layer CCL may include a number of lines, including circuit elements that allow the light-emitting elements ED to emit light.

The first substrate SUB may be an insulating substrate. The first substrate SUB may be made of an insulating material such as glass, quartz, and a polymer resin. The first substrate SUB may be either a rigid substrate or a flexible substrate that can be bent, folded, or rolled.

A first conductive layer may be disposed on the first substrate SUB. The first conductive layer includes a bottom metal layer BML. The bottom metal layer BML is disposed to overlap an active layer ACT1 of a first transistor T1. The bottom metal layer BML may include a material that blocks light, and thus can prevent light from entering the active layer ACT1 of the first transistor T1. For example, the bottom metal layer BML may be made of an opaque metal material that blocks light transmission. However, the embodiments are not limited thereto. In some embodiments, the bottom metal layer BML may be eliminated.

A buffer layer BL may be disposed on the first substrate SUB, entirely covering the first conductive layer. The buffer layer BL may be formed on the first substrate SUB to protect the first thin-film transistor T1 from moisture permeating through the first substrate SUB (which may be susceptible to moisture permeation) and may also provide a flat surface.

The semiconductor layer is disposed on the buffer layer BL. The semiconductor layer may include the first active layer ACT1 of the first transistor T1. According to an embodiment, the semiconductor layer may include polycrystalline silicon, monocrystalline silicon, an oxide semiconductor, etc. The polycrystalline silicon may be formed by crystallizing amorphous silicon. When the semiconductor layer includes an oxide semiconductor, the first active layer ACT1 may include multiple conductive regions and a channel region therebetween. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

In other embodiments, the semiconductor layer may include polycrystalline silicon. The polycrystalline silicon may be formed by crystallizing amorphous silicon, and the conductive regions of the first active layer ACT1 may be doped regions doped with impurities. However, the embodiments are not limited thereto.

A first gate insulator GI may be disposed on the semiconductor layer and the buffer layer BL. For example, the first gate insulator GI may be disposed on the upper surfaces of the semiconductor layer and the buffer layer BL. The first gate insulator GI may work as a gate insulator of each of the thin-film transistors.

The second conductive layer may be disposed on the first gate insulator GI. The second conductive layer may include a first gate electrode G1 of the first transistor T1 and a first capacitor electrode CSE1 of a storage capacitor. Although not shown in the drawings, the second conductive layer may further include multiple scan lines connected to the sub-pixels PXn. The first gate electrode G1 of the second conductive layer may be disposed to partially overlap the first active layer ACT1 of the first transistor T1. The first capacitor electrode CSE1 of the storage capacitor may be disposed such that it overlaps a second capacitor electrode CSE2 described below.

A first interlayer dielectric layer IL1 is disposed on the second conductive layer. The first interlayer dielectric layer IL1 may be disposed so that it covers the second conductive layer to protect it.

The third conductive layer may be disposed on the first interlayer dielectric layer IL1. The third conductive layer may include a first source electrode S1 and a first drain electrode D1 of the first transistor T1 and a second capacitor electrode CSE2 of the storage capacitor. Although not shown in the drawings, the third conductive layer may further include multiple data lines connected to the sub-pixels PXn.

The first source electrode S1 and the first drain electrode D1 of the first transistor T1 are disposed to partially overlap the first active layer ACT1. The first source electrode S1 and the first drain electrode D1 may be in contact with the first active layer ACT1 through contact holes penetrating the first interlayer dielectric layer IL1 and the first gate insulator GI, respectively. The first source electrode S1 may be in contact with the bottom metal layer BML through a contact hole penetrating the first interlayer dielectric layer ILL the first gate insulator GI, and the buffer layer BL. The first drain electrode D1 may be electrically connected to a first voltage line VL1 to be described below, and the first source electrode S1 may be connected to a first conductive pattern CDP connected to the first electrode RME1.

A second interlayer dielectric layer IL2 is disposed on the third conductive layer. The second interlayer dielectric layer IL2 may serve as an insulating layer between the third conductive layer and other layers disposed thereon. The second interlayer dielectric layer IL2 may cover the third conductive layer to protect it. The second interlayer dielectric layer IL2 may provide a flat surface.

The fourth conductive layer is disposed on the second interlayer dielectric layer IL2. The fourth conductive layer may include a first voltage line VL1, a second voltage line VL2, and a first conductive pattern CDP.

A high-level voltage (or a first supply voltage) may be applied to the first voltage line VL1 to be supplied to the first transistor T1, and a low-level voltage (or a second supply voltage) may be applied to the second voltage line VL2 to be supplied to the second electrode RME2.

The first voltage line VL1 and the second voltage line VL2 may be extended in the second direction DR2. The first voltage line VL1 and the second voltage line VL2 may be disposed at such locations that they partially overlapping the electrodes RME in the thickness direction. The first voltage line VL1 and the second voltage line VL2 may traverse the emission areas EMA.

The first electrode pattern CDP may be electrically connected to the first source electrode S1. The first conductive pattern CDP may also come in contact with the first electrode RME1 to be described below. The first transistor T1 may transfer the first supply voltage VDD applied from the first voltage line VL1 to the first electrode RME1 through the first conductive pattern CDP. Although the fourth conductive layer includes one first voltage line VL1 and one second voltage line VL2 in the example shown in the drawings, the embodiments are not limited thereto. The fourth conductive layer may include more than one first voltage lines VL1 and second voltage lines VL2.

The first to fourth conductive layers may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof. However, the embodiments are not limited thereto.

The buffer layer BL, the first gate insulator GI, the first interlayer dielectric layer IL1 and the second interlayer dielectric layer IL2 may be made up of a single layer, multiple layers, or multiple inorganic layers formed by stacking the layers alternately. For example, the buffer layer BL, the first gate insulator GI, the first interlayer dielectric layer IL1 and the second interlayer dielectric layer IL2 may be made up of an inorganic layer including at least one of silicon oxide (SiOx), silicon nitride (SiNx) and silicon oxynitride (SiON), or may be made up of multiple layers formed by alternately stacking such inorganic layers, or a double layer formed by sequentially stacking silicon oxide (SiOx) and silicon nitride (SiNx) layers.

A third interlayer dielectric layer IL3 is disposed on the fourth conductive layer. The third interlayer dielectric layer IL3 may include an organic insulating material to provide a flat surface over the conductive layers thereunder. For example, the third interlayer dielectric layer IL3 may include an organic material such as polyimide (PI), to provide a flat surface.

On the third interlayer dielectric layer IL3, a first bank BNL1, a second bank BNL2, electrodes RME, a light-emitting element ED, a third bank BNL3, and contact electrodes CNE may be disposed. The insulating layers PAS1, PAS2 and PAS3 may be further disposed on the third interlayer dielectric layer IL3.

Multiple first banks BNL1 and a second bank BNL2 may be disposed directly on the third interlayer dielectric layer IL3. In each sub-pixel PXn, the first banks BNL1 and a single second bank BNL2 may be disposed, with the second bank BNL2 spaced apart from the first banks BNL1 and disposed between the first banks BNL1. The light-emitting elements ED may be disposed between the first banks BNL1 and the second bank BNL2, which may be spaced apart from each other in the first direction DR1.

The first banks BNL1 may be disposed in the emission areas EMA of the sub-pixels PXn and may be spaced apart from one another. For example, the first banks BNL1 may include multiple sub-banks BNL_A and BNL_B spaced apart from each other in the first direction DR1 in each emission area EMA. The first sub-bank BNL_A may be disposed on the left side of the center of the emission area EMA, and the second sub-bank BNL_B may be disposed on the right side. The sub-banks BNL_A and BNL_B may have a shape extended in the second direction DR2. The length of the sub-banks BNL_A and BNL_B in the second direction DR2 may be smaller than the length of the open area surrounded by the third bank BNL3 in the second direction DR2. In a single sub-pixel PXn, two first sub-banks BNL_A and two second sub-banks BNL_B may be disposed such that they are spaced apart from one another in the second direction DR2. The first banks BNL1 may form an island-like pattern extending in one direction on the front surface of the display area DPA.

The second bank BNL2 may be disposed between the first banks BNL1 spaced apart in the first direction DR1. The second bank BNL2 may be extended in the second direction DR2 and may have a part disposed in the emission area EMA with a large width. As an example, the second bank BNL2 is formed such that its part facing the first bank BNL1 has a large width, and may be extended in the second direction DR2 between the first sub-bank BNL_A and the second sub-bank BNL_B. Unlike the first banks BNL1, the second banks BNL2 may extend beyond the emission areas EMA into the sub-areas SA. The second banks BNL2 may be disposed in the sub-pixels PXn adjacent to each other in the second direction DR2 to form a linear pattern on the front surface of the display area DPA.

The first banks BNL1 and the second banks BNL2 may have a structure that at least partly protrudes from the upper surface of the third interlayer dielectric layer IL3. The protruding parts of the first banks BNL1 and the second banks BNL2 may have inclined side surfaces. The light emitted from the light-emitting elements ED may be reflected by the electrodes RME disposed on the first banks BNL1 and the second banks BNK2 so that the light may exit toward the upper side of the third interlayer dielectric layer IL3. The first banks BNL1 and the second banks BNL2 may provide the area in which the light-emitting elements ED is disposed and may also serve as reflective walls that reflect light emitted from the light-emitting elements ED upward. For example, a layer including a material having a high reflectivity may be further disposed on the first banks BNL1 and the second banks BNL2, and the layer may reflect the light emitted from the light-emitting elements ED. The side surfaces of the first banks BNL1 and the second banks BNL2 may be inclined in a linear shape (having a flat sloped outer surface), but the embodiments are not limited thereto. The first banks BNL1 and the second banks BNL2 may have a semicircle or semi-ellipse shape with curved outer surface. The first banks BNL1 and the second banks BNL2 may include, but is not limited to, an organic insulating material such as polyimide (PI).

The electrodes RME may have a shape extended in one direction and are disposed in each of the sub-pixels PXn. For example, the electrodes RME may have a shape extended in the second direction DR2 and may be spaced apart from each other in the first direction DR1 and the second direction DR2 in each of the sub-pixels PXn. According to an embodiment, the electrodes RME may be divided into electrode groups RME #1 and RME #2 including multiple electrodes arranged side-by-side and spaced apart each other in the first direction DR1, and each of the electrode groups RME #1 and RME #2 may be spaced apart from each other in the second direction DR2.

For example, a sub-pixel PXn may include a first electrode group RME #1 and a second electrode group RME #2 spaced apart from each other in the second direction DR2. The first electrode group RME #1 may be disposed on the upper side with respect to the center of the emission area EMA in the second direction DR2, while the second electrode group RME #2 may be disposed on the lower side of the emission area EMA and may be spaced apart from the first electrode group RME #1 in the second direction DR2. The first electrode group RME #1 and the second electrode group RME #2 of the sub-pixel PXn may be spaced apart from each other by a first region ROP1 located in the emission area EMA.

The electrodes RME of the first electrode group RME #1 may extend beyond the third bank BNL3 into the sub-areas SA of the sub-pixel PXn. The electrodes RME of the second electrode group RME #2 may also extend beyond the third bank BNL3. In FIG. 3, the electrodes RME of the second electrode group RME #2 may extend into the sub-area the sub-pixel located lower than sub-pixel PX1 in the direction DR2. In the sub-area SA, the first electrode group RME #1 and the second electrode group RME #2 of different sub-pixels may be disposed and spaced apart from each other. The first electrode group RME #1 and the second electrode group RME #2 of different sub-pixels PXn may be spaced apart from each other by a second region ROP2 located in the sub-areas SA of the sub-pixels PXn.

The electrodes of the different electrode groups RME #1 and RME #2 may be arranged side-by-side and spaced apart from each other in the second direction DR2. For example, one electrode belonging to the first electrode group RME #1 may be arranged in line with one electrode belonging to the second electrode group RME #2 in the second direction DR2. The electrodes RME may be formed by forming single electrode lines extended in the second direction DR2 and then separating them from one another during a subsequent process after the light-emitting elements ED have been disposed. The electrode line may be used to generate an electric field in the sub-pixel PXn to align the light-emitting elements ED during the process of fabricating the display device 10. The light-emitting elements ED may receive a dielectrophoretic force from the electric field generated over the electrode lines and the light-emitting elements may be aligned on the electrodes RME. After aligning the light-emitting elements ED, the electrode lines may be separated in the first region ROP1 and the second region ROP2, such that the electrode groups RME #1 and RME #2 become spaced apart from each other in the second direction DR2.

The electrodes included in each of the electrode groups RME #1 and RME #2 will be described in detail. The first electrode group RME #1 may include a first electrode RME1, a second electrode RME2, a third electrode RME3 and a fourth electrode RME4. The second electrode group RME #2 may include a fifth electrode RME5, a sixth electrode RME6, a seventh electrode RME7 and an eighth electrode RME8. The electrodes RME disposed in each of the sub-pixels PXn may be disposed on the first banks BNL1 or second banks BNL2 spaced apart from one another.

The first electrode RME1 may be disposed on the upper left side with respect to the center of the emission area EMA. Part of the first electrode RME1 may be disposed on the first sub-bank BNL_A disposed on the upper side of the emission area EMA. The second electrode RME2 may be spaced apart from the first electrode RME1 in the first direction DR1 and may be disposed adjacent to the center of the emission area EMA. Part of the second electrode RME2 may be disposed on one side of the second bank BNL2 that faces the second sub-bank BNL_B.

Each of the first electrode RME1 and the second electrode RME2 may be a first type electrode connected to the fourth conductive layer thereunder. The first electrode RME1 and the second electrode RME2 may be connected to the fourth conductive layer through electrode contact holes CTD and CTS formed at such locations that they overlap with the third bank BNL3, respectively. For example, the first electrode RME1 may be in contact with the first conductive pattern CDP through the first contact hole CTD penetrating the third interlayer dielectric layer IL3. The second electrode RME2 may be in contact with the second voltage line VL2 through the second contact hole CTS penetrating through the third interlayer dielectric layer IL3. The first electrode RME1 may be electrically connected to the first transistor T1 through the first conductive pattern CDP to receive the first supply voltage. The second electrode RME2 may be electrically connected to the second voltage line VL2 to receive the second supply voltage. Since the first electrode RME1 and the second electrode RME2 are disposed separately in each of the sub-pixels PXn, the light-emitting elements ED in different sub-pixels PXn may emit light independently. Although the first electrode contact hole CTD and the second electrode contact hole CT2 are formed at such locations that they overlap the third bank BNL3 in the drawings, the embodiments are not limited thereto. For example, the electrode contact holes CTD and CTS may be located in the emission area EMA surrounded by the third bank BNL3.

The third electrode RME3 may be disposed between the first electrode RME1 and the second electrode RME2. The third electrode RME3 may be spaced apart from and face the first electrode RME1 and may be disposed on the second bank BNL2 and spaced apart from the second electrode RME2. A part of the third electrode RME3 may be disposed on the opposite side of the second bank BNL2 that faces the first sub-bank BNL_A located on the upper side of the emission area EMA. The fourth electrode RME4 may be spaced apart from the second electrode RME2 in the first direction DR1. The fourth electrode RME4 may face the second electrode RME2 and may be disposed on the upper right side with respect to the center of the emission area EMA. A part of the fourth electrode RME4 may be disposed on one side of the second sub-bank BNL_B disposed on the upper side that faces the second bank BNL2.

The fifth electrode RME5 may be disposed on the lower left side with respect to the center of the emission area EMA. The fifth electrode RME5 may be spaced apart from the first electrode RME1 in the second direction DR2, and a part of the fifth electrode RME5 may be disposed on one side of the first sub-bank BNL_A disposed on the lower side of the emission area EMA. The sixth electrode RME6 may be spaced apart from the fifth electrode RME5 in the first direction DR1, and may be disposed adjacent to the center of the emission area EMA to be spaced apart from the second electrode RME2 in the second direction DR2. A part of the sixth electrode RME6 may be disposed on one side of the second bank BNL2 that faces the second sub-bank BNL_B located on the lower side of the emission area EMA.

The seventh electrode RME7 may be disposed between the fifth electrode RME5 and the sixth electrode RME6. The seventh electrode RME7 may be spaced apart from and face the fifth RME5 and may be disposed on the second bank BNL2 and spaced apart from the sixth electrode RME6. A part of the seventh electrode RME7 may be disposed on the opposite side of the second bank BNL2 that faces the first sub-bank BNL_A located on the lower side of the emission area EMA. The eighth electrode RME8 may be spaced apart from the sixth electrode RME6 in the first direction DR1. The eighth electrode RME8 may face the sixth electrode RME6 and may be disposed on the lower right side with respect to the center of the emission area EMA such that it may be spaced apart from the fourth electrode RME4 in the second direction DR2. A part of the eighth electrode RME8 may be disposed on one side of the second sub-bank BNL_B disposed on the lower side that faces the second bank BNL2. Thus, the first to eighth electrodes RME1 to RME8 may be spaced apart from one another in the first direction and in the second direction, and each of the electrodes may have a shape extending in the second direction.

Unlike the first type electrodes, the third electrode RME3 to the eighth electrode RME8 may be second type electrodes that are not directly connected to the fourth conductive layer thereunder. The second type electrodes may receive an electric signal directly applied to the first type electrodes through the light-emitting elements ED or the contact electrodes CNE. The third to eighth electrodes RME3 to RME8 are not directly connected to the fourth conductive layer thereunder, but the electrical signals applied therefrom may be transmitted and thus they are not floating.

According to an embodiment, the width of the electrodes RME measured in the first direction DR1 may be smaller than the width of the first banks BNL1 and the second bank BNL2 measured in the first direction DR1. Each of the electrodes RME may be disposed to cover at least one side of the first banks BNL1 or the second bank BNK2 to reflect light emitted from the light-emitting elements ED. The spacing between the electrodes RME spaced apart from each other in the first direction DR1 may be smaller than the spacing between the first banks BNL1 and the second bank BNL2. At least a part of each of the electrodes RME may be disposed directly on the third interlayer dielectric layer IL3 so that they may be disposed on the same plane.

The electrodes RME may be electrically connected to the light-emitting elements ED. The electrodes RME may be connected to both ends of the light-emitting elements ED through the contact electrodes CNE to be described below, and may transmit electric signals applied from the fourth conductive layer to the light-emitting elements ED. Electrical signals for allowing light-emitting elements ED to emit light may be directly applied to the first electrode RME1 and the second electrode RME2, which are the first type electrodes, and the electric signals may be transmitted to the other electrodes through contact electrodes CNE and light-emitting elements ED, which will be described below.

Each of the electrodes RME may include a conductive material having a high reflectance. For example, the electrodes RME may include a metal such as silver (Ag), copper (Cu) and aluminum (Al) as the material having a high reflectance, and may be an alloy including aluminum (Al), nickel (Ni), lanthanum (La), etc. The electrodes RME may reflect light that is emitted from the light-emitting elements ED and travels toward the side surfaces of the first banks BNL1 or the second banks BNL2 toward the upper side of each of the sub-pixels PXn.

However, the embodiments are not limited thereto. The electrodes RME may further include a transparent conductive material. For example, each of the electrodes RME may include a material such as ITO, IZO and ITZO. In some embodiments, each of the electrodes RME1 and RME2 may have a structure in which one or more layers of a transparent conductive material and one or more metal layers having high reflectivity are stacked on one another, or may be made up of a single layer including them. For example, each of the electrodes RME may have a stack structure such as ITO/Ag/ITO/, ITO/Ag/IZO, or ITO/Ag/ITZO/IZO.

Although the first electrode group RME #1 and the second electrode group RME #2 are separated from each other in the first region ROP1 located in the emission area EMA in each of the sub-pixels PXn in the drawings, the embodiments are not limited thereto. In some embodiments, the electrodes disposed in each of the sub-pixels PXn may not be separated from one another but may be connected to each other in the first region ROP1, and thus may not be divided into different electrode groups RME #1 and RME #2. The number of the electrodes RME belonging to each of the electrode groups RME #1 and RME #2 may vary depending on the number of light-emitting elements ED disposed in each of the sub-pixels PXn.

The first insulating layer PAS1 may be disposed on the electrodes RME, the first banks BNL1 and the second banks BNL2. The first insulating layer PAS1 may be disposed to entirely cover the electrodes RME, the first bank BNL1 and the second bank BNL2, and may protect the electrodes RME while insulating them from one another. The first insulating layer PAS1 may also prevent damage to the light-emitting elements ED which are disposed on the first insulating layer PAS1, by preventing the light-emitting elements ED from coming into contact with other elements.

In an embodiment, the first insulating layer PAS1 may have steps so that a part of the upper surface is recessed between the electrodes RME spaced apart from each other in the first direction DR1. The light-emitting elements ED may be disposed in the steps of the upper surface of the first insulating layer PAS1, and a space may be formed between the light-emitting elements ED and the first insulating layer PAS1. However, the embodiments are not limited thereto.

The first insulating layer PAS1 may include contact holes CT1 and CT2 exposing a part of the upper surface of each of the electrodes RME. The contact holes CT1 and CT2 may penetrate through the first insulating layer PAS1, and the contact electrodes CNE described below may be in contact with the electrodes RME exposed through the contact holes CT1 and CT2.

The third bank BNL3 may be disposed on the first insulating layer PAS1. The third bank BNL3 may be disposed in a lattice pattern including parts extended in the first direction DR1 and the second direction DR2 in a plan view, and may be disposed at the boundaries of the sub-pixels PXn to distinguish the adjacent sub-pixels PXn from each other. The third bank BNL3 may be disposed to surround the emission area EMA and the sub-area SA disposed in each of the sub-pixels PXn to distinguish them. The part of the third bank BNL3 that is extended in the second direction DR2 and disposed between the emission areas EMA may have a larger width than the part disposed between the sub-areas SA. The distance between the sub-areas SA may be smaller than the distance between the emission areas EMA. However, the embodiments are not limited thereto. The width of the third bank BNL3 may vary and the distance between the sub-areas SA may be larger than the distance between the emission areas EMA.

The third bank BNL3 may have a height greater than that of each of the first bank BNL1 and the second bank BNL2. The third bank BNL3 can prevent the ink in which different light-emitting elements ED are dispersed from overflowing to adjacent sub-pixels PXn during the inkjet printing process of the processes of fabricating the display device 10, so that different sub-pixels PXn can be separated from one another and the ink is not mixed. The third bank BNL3 may include, but is not limited to, polyimide (PI), like the first banks BNL1.

The light-emitting elements ED may be disposed on the first insulating layer PAS1. The light-emitting elements ED may be spaced apart from one another in the second direction DR2 in which the electrodes RME are extended, and may be aligned substantially parallel to one another. The light-emitting elements ED may have a shape extended in one direction. The direction in which the electrodes RME are extended may be substantially perpendicular to the direction in which the light-emitting elements ED are extended. However, the embodiments are not limited thereto. The light-emitting elements ED may be oriented obliquely to the direction in which the electrodes RME are extended.

The light-emitting elements ED may include semiconductor layers doped to have different conductivity types. The light-emitting elements ED may include multiple semiconductor layers and may be aligned so that their ends are directed in a particular orientation depending on the direction of the electric field generated over the electrodes RME. Each of the light-emitting elements ED may include an emissive layer 36 (refer to FIG. 6) to emit light of a particular wavelength band. The light-emitting elements ED disposed in each of the sub-pixels PXn may emit light of different wavelength bands depending on the material of the emissive layer 36. However, the embodiments are not limited thereto. The light-emitting elements ED disposed in the sub-pixels PXn may emit light of the same color.

The light-emitting elements ED may include multiple layers disposed on the upper surface of the first substrate SUB in the direction parallel to it. The light-emitting elements ED of the display device 10 may be arranged such that they are extended in parallel to the first substrate SUB. The multiple semiconductor layers included in the light-emitting elements ED may be disposed sequentially in the direction parallel to the upper surface of the first substrate SUB. However, the embodiments are not limited thereto. In some embodiments, when the light-emitting elements ED have a different structure, multiple layers may be disposed in a direction perpendicular to the first substrate SUB.

The light-emitting elements ED may be disposed on the electrodes RME spaced apart from each other between the first banks BNL1 and the second bank BNL2 in the first direction DR1. The length of the light-emitting elements ED may be larger than the distance between the electrodes RME spaced apart from each other in the first direction DR1, and the both ends of the light-emitting elements ED may be disposed on different electrodes, respectively. For example, the light-emitting elements ED may include a first light-emitting element ED1 having ends disposed on the first electrode RME1 and the third electrode RME3 of the first electrode group RME #1, respectively, and a second light-emitting element ED2 having ends disposed on the second electrode RME2 and the fourth electrode RME4 of the first electrode group RME #1, respectively. For example, the light-emitting elements ED may include a third light-emitting element ED3 having ends disposed on the fifth electrode RME5 and the seventh electrode RME7 of the second electrode group RME #2, respectively, and a fourth light-emitting element ED4 having ends disposed on the sixth electrode RME6 and the eighth electrode RME8 of the second electrode group RME #2, respectively.

Each of the light-emitting elements ED may include multiple semiconductor layers, and a first end and a second end opposite to the first end may be defined based on one of the semiconductor layers. Each of the light-emitting elements ED may be disposed such that the first end and the second end are placed on the respective electrodes RME. For example, the first light-emitting element ED1 may be disposed such that the first end is placed on the first electrode RME1 and the second end is placed on the third electrode RME3. The second light-emitting element ED2 may be disposed such that the first end is placed on the fourth electrode RME4 and the second end is placed on the second electrode RME2. Similarly, the third light-emitting element ED3 may be disposed such that the first end is placed on the fifth electrode RME5 and the second end is placed on the seventh electrode RME7. The fourth light-emitting element ED4 may be disposed such that the first end is placed on the eighth electrode RME8 and the second end is placed on the sixth electrode RME6. Each of the light-emitting elements ED may have the first end and the second end electrically connected to different electrodes RME. Thus, each of the light-emitting elements ED may include ends disposed on the electrodes spaced apart from one another in the first direction. However, the embodiments are not limited thereto. The light-emitting elements ED may be disposed such that only one end is placed on the electrode RME depending on the orientation between the electrodes RME.

The ends of each of the light-emitting elements ED may be in contact with the contact electrodes CNE, respectively. As a part of the semiconductor layer of each of the light-emitting elements ED is exposed because the insulating layer 38 (refer to FIG. 6) is not formed at the end surface on the side of the extending direction, the exposed part of the semiconductor layer may be in contact with the contact electrode CNE. However, the embodiments are not limited thereto. In some embodiments, at least a part of the insulating layer 38 is removed and the insulating layer 38 is removed, so that the end surfaces of the semiconductor layers of the light-emitting elements ED may be partially exposed. The exposed side surfaces of the semiconductor layer may be in contact with the contact electrodes CNE.

The light-emitting elements ED may be electrically connected to the electrodes RME through the contact electrodes CNE.

The second insulating layer PAS2 may be partially disposed on the light-emitting elements ED. For example, the second insulating layer PAS2 may be disposed to partially surround the outer surfaces of the light-emitting elements ED so that the first end and the second end of each of the light-emitting elements ED are not covered. The second insulating layer PAS2 may be extended in the second direction DR2 between the first banks BNL1 and the second bank BNL2. The part of the second insulating layer PAS2 that does not overlap the light-emitting elements ED may be disposed directly on the first insulating layer PAS1. The second insulating layer PAS2 may have such a shape as it is initially formed to entirely cover the first insulating layer PAS1 during the process of fabricating the display device 10 and then may be removed during the process of exposing the end portions of the light-emitting elements ED. The second insulating layer PAS2 may be extended in the second direction DR2 on the first insulating layer PAS1 in a plan view, thereby forming a linear or island-like pattern in each of the sub-pixels PXn. The second insulating layer PAS2 can protect the light-emitting elements ED and fix the light-emitting elements ED during the process of fabricating the display device 10. The second insulating layer PAS2 may be disposed to fill the space between light-emitting elements ED and the first insulating layer PAS1 thereunder.

As the second insulating layer PAS2 partially covers the light-emitting elements ED and has a shape extended in the second direction DR2, it may have the length in the second direction DR2 larger than the line width or the width measured in the first direction DR1. According to an embodiment, the second insulating layer PAS2 may include extended portions PE (refer to FIG. 7) that are disposed between the electrode RME and extended in the second direction DR2, and pattern portions PT (refer to FIG. 7) connected to the extended portions PE and expanded in the first direction DR1. The pattern portions PT may have a width greater than the width of each of the extended portions PE in the first direction, or the pattern portions PT may be disposed to surround a predetermined area so that it may have a shape larger than the extended portion PE. As the second insulating layer PAS2 includes the pattern portions PT, it is possible to prevent the extended portions PE (which have a length larger than the width) from becoming delaminated from the first insulating layer PAS1 or the light-emitting elements ED during the process of forming contact electrodes CNE, which will be described below. The shape of the second insulating layer PAS2 will be described in more detail.

The contact electrodes CNE may be disposed on the second insulating layer PAS2. Each contact electrode CNE may be in contact with one of the ends of each light-emitting element ED and at least one electrode RME. For example, the contact electrodes CNE may be in contact with one of the ends of the light-emitting elements ED exposed where the second insulating layer PAS2 is not disposed, and at least one of the electrodes RME through the contact holes CT1 and CT2 that are formed in the first insulating layer PAS1 and expose parts of the electrodes RME. The semiconductor layer is exposed at the both end surfaces of each of the light-emitting elements ED, and the contact electrodes CNE may be in contact with the light-emitting elements ED where the semiconductor layer is exposed. Thus, each of the ends of the light-emitting elements ED may be electrically connected to the electrodes RME through different contact electrodes CNE.

The contact electrodes CNE may be disposed on substantially the same layer. For example, one side of the contact electrodes CNE may be in contact with the light-emitting elements ED and disposed on the second insulating layer PAS2, while the other side thereof may be disposed on the first insulating layer PAS1 disposed on the electrodes RME. In other embodiments, part of the contact electrodes CNE may be in contact with the electrodes RME through the contact holes CT1 and CT2 penetrating the first insulating layer PAS1.

According to an embodiment, the contact electrodes CNE of the display device 10 may be divided into different types of contact electrodes electrically connected to different types of electrodes. For example, the contact electrodes CNE may include a first contact electrode CNE1 and a second contact electrode CNE2 as first type contact electrodes disposed on the first electrode RME1 or the second electrode RME2, which are the first type electrodes.

The first contact electrode CNE1 and the second contact electrode CNE2 may be disposed on parts of the first electrode RME1 and the second electrode RME2, respectively. Each of the first contact electrode CNE1 and the second contact electrode CNE2 may be extended in the second direction DR2, and they may form a linear pattern inside the emission area EMA of each of the sub-pixels PXn. The first contact electrode CNE1 may be in contact with the first electrode RME1 through the first contact hole CT1 exposing a part of the upper surface of the first electrode RME1, and the second contact electrode CNE2 may be in contact with the second electrode through the first contact hole CT1 exposing a part of the upper surface of the second electrode RME2. The first contact electrode CNE1 may be in contact with the first end of the first light-emitting element ED1, and the second contact electrode CNE2 may be in contact with the second end of the second light-emitting element ED2.

The first electrode RME1 and the second electrode RME2, which are the first type electrodes, may be directly connected to the fourth conductive layer. The first contact electrode CNE1 and the second contact electrode CNE2, which are the first type contact electrodes, may transmit the electric signals applied to the first type electrodes to certain ends of the light-emitting elements ED. The electric signal may be directly applied to the first end of the first light-emitting element ED1 and the second end of the second light-emitting element ED2. The electric signal may be transmitted to other contact electrodes CNE and the light-emitting elements ED through the second end of the first light-emitting element ED1 and the first end of the second light-emitting element DE2.

The contact electrodes CNE may include a third contact electrode CNE3, a fourth contact electrode CNE4 and a fifth contact electrode CNE5 as second type contact electrodes disposed on one or more of the third electrode RME3 to eighth electrode RME8, which are the second type electrodes.

The third contact electrode CNE3 may be disposed on the third electrode RME3 and the fifth electrode RME5. The third contact electrode CNE3 may include a first electrode extension CN_E1 and a second electrode extension CN_E2 extended in the second direction DR2, and a first electrode bridge CN_B1 that connects the first electrode extension CN_E1 with the second electrode extension CN_E2 in the first region ROP1 of the emission area EMA. The third contact electrode CNE3 may be generally extended in the second direction DR2 and may have a bent shape so that it can be disposed on the third electrode RME3 and the fifth electrode RME5. The first electrode extension CN_E1 may be disposed on the third electrode RME3 to be in contact with the third electrode RME3 and the first light-emitting element ED1. The first electrode extension CN_E1 may be in contact with the second end of the first light-emitting element ED1 and the third electrode RME3 exposed via the second contact hole CT2. The second electrode extension CN_E2 may be disposed on the fifth electrode RME5 to be in contact with the fifth electrode RME5 and the third light-emitting element ED3. The second electrode extension CN_E2 may be in contact with the first end of the third light-emitting element ED3 and the fifth electrode RME5 exposed via the second contact hole CT2. The first electrode bridge CN_B1 may have a shape extended in the first direction DR1 in the first region ROP1.

The fourth contact electrode CNE4 may be disposed on the seventh electrode RME7 and the eighth electrode RME8. The fourth contact electrode CNE4 may include a third electrode extension CN_E3 and a fourth electrode extension CN_E4 extended in the second direction DR2, and a second electrode bridge CN_B2 that connects the third electrode extension CN_E3 with the fourth electrode extension CN_E4 on the lower side of the emission area EMA. The fourth contact electrode CNE4 may have a shape spaced apart from and surrounding a fifth electrode extension CN_E5 of the fifth contact electrode CNE5 to be described below. The third electrode extension CN_E3 may be disposed on the seventh electrode RME7 to be in contact with the seventh electrode RME7 and the second end of the third light-emitting element ED3. The fourth electrode extension CN_E4 may be disposed on the eighth electrode RME8 to be in contact with the eighth electrode RME8 and the first end of the fourth light-emitting element ED4. The second electrode bridge CN_B2 may be disposed in the space between the third bank BNL3 and the first bank BNL1 on the lower side of the emission area EMA.

The fifth contact electrode CNE5 may have a shape similar to that of the third contact electrode CNE3 and may be disposed on the sixth electrode RME6 and the fourth electrode RME4. The fifth contact electrode CNE5 may include a fifth electrode extension CN_E5 and a sixth electrode extension CN_E6 extended in the second direction DR2, and a third electrode bridge CN_3 that connects the fifth electrode extension CN_E5 with the sixth electrode extension CN_E6 in the first region ROP1 of the emission area EMA. The fifth electrode extension CN_E5 may be disposed on the sixth electrode RME6 to be in contact with the sixth electrode RME6 and the second end of the fourth light-emitting element ED4, and the sixth electrode extension CN_E6 may be disposed on the fourth electrode RME4 to be in contact with the fourth electrode RME4 and the first end of the second light-emitting element ED2. The third electrode bridge CN_B3 may have a shape extended in the first direction DR1 in the first region ROP1.

The first light-emitting element ED1 and the third light-emitting element ED3 may be electrically connected to each other through the third contact electrode CNE3. The electric signal applied through the first contact electrode CNE1 may be transmitted to the third light-emitting element ED3 through the first light-emitting element ED1 and the third contact electrode CNE3. Similarly, the electric signal may be transmitted to the fourth light-emitting element ED4 and the second light-emitting element ED2 through the fourth and fifth contact electrodes CNE4 and the fifth contact electrode CNE5. The light-emitting elements ED disposed in one sub-pixel PXn may be connected in series through the second type contact electrodes.

The contact holes CT1 and CT2 formed at such locations that the contact electrodes CNE and the electrode RME are in contact with each other may not overlap the light-emitting elements ED in the first direction DR1. For example, each of the contact holes CT1 and CT2 may be spaced apart in the second direction DR2 from the areas in which the light-emitting elements ED are disposed, and may be disposed adjacent to the part of the third bank BNL3 extended in the first direction DR1. Lights are emitted from the both ends of the light-emitting elements ED, and the contact holes CT1 and CT2 may be located to avoid the paths of the lights. However, the embodiments are not limited thereto. The locations of the contact holes CT1 and CT2 may vary depending on the structure of the electrodes RME and the locations of the light-emitting elements ED.

Although only one first contact electrode CNE1, only one second contact electrode CNE2, only one third contact electrode CNE3, only one fourth contact electrode CNE4 and only one fifth contact electrode CNE5 are disposed in one sub-pixel PXn in the drawings, the embodiments are not limited thereto. The number and the shape of the contact electrodes CNE1, CNE2, CNE3, CNE4 and CNE5 may vary depending on the number of electrodes RME disposed in each of the sub-pixels PXn.

The contact electrodes CNE may include a conductive material. For example, the contact electrodes may include ITO, IZO, ITZO, aluminum (Al), etc. For example, the contact electrodes CNE may include a transparent conductive material, and light emitted from the light-emitting elements ED may transmit the contact electrodes CNE to proceed toward the electrodes RME. However, the embodiments are not limited thereto.

Although not shown in the drawings, an insulating layer may be disposed on the contact electrodes CNE and the third bank BNL3 to cover them. The insulating layer may be disposed entirely on the first substrate SUB to protect the elements disposed thereon against the external environment.

Each of the first insulating layer PAS1 and the second insulating layer PAS2 may include an inorganic insulating material or an organic insulating material. According to an embodiment, the first insulating layer PAS1 and the second insulating layer PAS2 may include an inorganic insulating material such as silicon oxide (SiOx), silicon nitride (SiNx), silicon oxynitride (SiOxNy), aluminum oxide (AlOx) and aluminum nitride (AlNx). Alternatively, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. However, the embodiments are not limited thereto.

Figure 6:
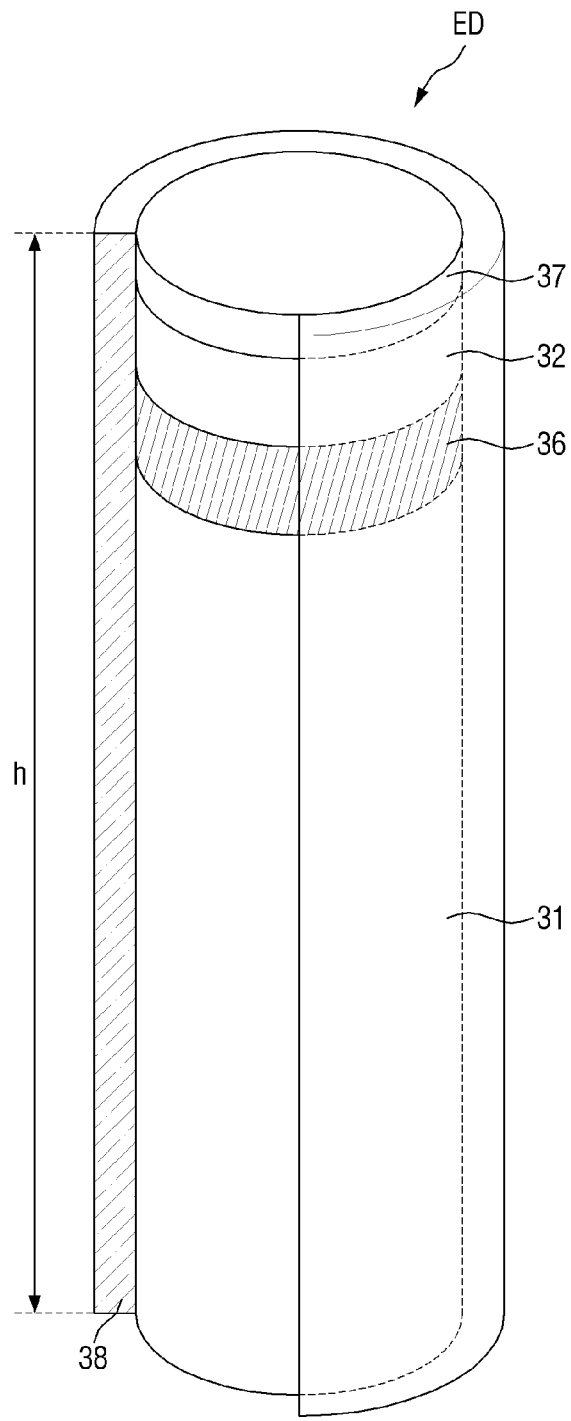
FIG. 6 is a perspective view showing a light-emitting element according to an embodiment.

FIG. 6 is a view showing a light-emitting element according to an embodiment.

The light-emitting elements ED may be light-emitting diodes. Specifically, the light-emitting elements ED may have size from micrometers to nanometers and may be inorganic light-emitting elements made of an inorganic material. Inorganic light-emitting diodes may be aligned between two electrodes facing each other as polarities are created by forming an electric field in a particular direction between the two electrodes. The light-emitting elements ED may be aligned between two electrodes by an electric field formed over the two electrodes.

The light-emitting element ED according to an embodiment may have a shape extended in one direction. The light-emitting element ED may have a shape of a cylinder, a rod, a wire, a tube, etc. It is to be understood that the shape of the light-emitting element ED is not limited thereto. The light-emitting element ED may have a variety of shapes including a polygonal column shape such as a cube, a cuboid and a hexagonal column, or a shape that is extended in a direction with partially inclined outer surfaces. The semiconductors included in the light-emitting element ED to be described below may have a structure sequentially arranged or stacked along a predetermined direction.

The light-emitting element ED may include a semiconductor layer doped with impurities of a conductive type (e.g., p-type or n-type). The semiconductor layer may emit light of a certain wavelength band by transmitting an electric signal applied from an external power source.

As shown in FIG. 6, the light-emitting element ED may include a first semiconductor layer 31, a second semiconductor layer 32, an emissive layer 36, an electrode layer 37 and an insulating layer 38.

The first semiconductor layer 31 may be an n-type semiconductor. When the light-emitting element ED emits light of a blue wavelength band, the first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of n-type doped AlGaInN, GaN, AlGaN, InGaN, AlN and InN. The first semiconductor layer 31 may be doped with an n-type dopant, and the n-type dopant may be Si, Ge, Sn, etc. For example, the first semiconductor layer 31 may be n-GaN doped with n-type Si. A first end of the light-emitting element ED may be a portion where the first semiconductor layer 31 is disposed with respect to the light emitting layer 36.

The second semiconductor layer 32 is disposed on the emissive layer 36 to be described below. The second semiconductor layer 32 may be a p-type semiconductor. When the light-emitting element ED emits light of a blue or green wavelength band, the second semiconductor layer 32 may include a semiconductor material having the following chemical formula: $Al_xGa_yIn_{1-x-y}N$ ($0 \le x \le 1$, $0 \le y \le 1$, $0 \le x+y \le 1$). For example, it may be at least one of p-type doped AlGaInN, GaN, AlGaN, InGaN, AlN and InN. The second semiconductor layer 32 may be doped with a p-type dopant, and the p-type dopant may be Mg, Zn, Ca, Se, Ba, etc. For example, the second semiconductor layer 32 may be p-GaN doped with p-type Mg. A second end of the light-emitting element ED may refer to the other side of the emissive layer 36 where the second semiconductor layer 32 is disposed.

Although each of the first semiconductor layer 31 and the second semiconductor layer 32 is implemented as a signal layer in the drawings, the embodiments are not limited thereto. Depending on the material of the emissive layer 36, the first semiconductor layer 31 and the second semiconductor layer 32 may further include a larger number of layers, e.g., a clad layer or a tensile strain barrier reducing (TSBR) layer.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein in response to an electrical signal applied through the first semiconductor layer 31 and the second semiconductor layer 32. When the emissive layer 36 emits light of the blue wavelength band, it may include a material such as AlGaN and AlGaInN. When the emissive layer 36 has a multi-quantum well structure in which quantum layers and well layers are alternately stacked on one another, the quantum layers may include AlGaN or AlGaInN, and the well layers may include a material such as GaN and AlGaN. For example, the emissive layer 36 includes AlGaInN as the quantum layer and AlInN as the well layer, and, as described above, the emissive layer 36 may emit blue light having a center wavelength band of 450 nm to 495 nm.

However, the embodiments are not limited thereto. The emissive layer 36 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some embodiments.

The light emitted from the emissive layer 36 may exit not only through the outer surfaces of the light-emitting element ED in the longitudinal direction but also through the both side surfaces. The direction in which the light emitted from the emissive layer 36 propagates is not limited to one direction.

The electrode layer 37 may be an ohmic contact electrode. However, the embodiments are not limited thereto. The element electrode layer may be Schottky contact electrodes. The light-emitting element ED may include at least one electrode layer 37. Although the light-emitting element ED includes one electrode layer 37 in the example shown in FIG. 6, the embodiments are not limited thereto. In some embodiments, the light-emitting element ED may include a larger number of electrode layers 37 or the electrode layer may be omitted. The following description on the light-emitting element ED may be equally applied even if the number of electrode layers 37 is different or it further includes other structures.

The electrode layer 37 may reduce the resistance between the light-emitting element ED and the electrodes or the contact electrodes when the light-emitting element ED is electrically connected to the electrodes or the contact electrodes in the display device 10 according to the embodiment. The electrode layer 37 may include a metal having conductivity. For example, the electrode layer 37 may include at least one of aluminum (Al), titanium (Ti), indium (In), gold (Au), silver (Ag), ITO, IZO and ITZO. The electrode layer 37 may include a semiconductor material doped with n-type or p-type impurities. However, the embodiments are not limited thereto.

The insulating layer 38 may be disposed to surround the outer surfaces of the semiconductor layers and electrode layers described above. For example, the insulating layer 38 may be disposed to surround at least the outer surface of the emissive layer 36, and may be extended in a direction in which the light-emitting element ED is extended. The insulating layer 38 may serve to protect the above-described elements. The insulating layer 38 may be formed to surround the side surfaces of the elements, and both ends of the light-emitting element ED in the longitudinal direction may be exposed.

Although the insulating layer 38 is extended in the longitudinal direction of the light-emitting element ED to cover from the first semiconductor layer 31 to the side surface of the electrode layer 37 in the example shown in the drawing, the embodiments are not limited thereto. The insulating layer 38 may cover only the outer surface of a part of the semiconductor layer, including the light-emitting layer 36, or may cover only a part a part of the outer surface of the electrode layer 37 to partially expose the outer surface of the electrode layer 37. A part of the upper surface of the insulating layer 38 may be rounded which is adjacent to at least one end of the light-emitting element ED in cross section.

The thickness of the insulating layer 38 may be, but is not limited to, in the range of about 10 nm to about 1.0 µm. For example, the thickness of the insulating layer 38 may be approximately about 40 nm.

The insulating layer 38 may include materials having insulating properties such as silicon oxide (SiOx), silicon nitride (SiNx), silicon oxynitride (SiOxNy), aluminum nitride (AlNx) and aluminum oxide (AlOx). Although the insulating layer 38 is formed as a single layer in the drawings, the embodiments are not limited thereto. In some embodiments, the insulating layer 38 may be formed as a double layer or a multilayer structure in which multiple layers are stacked on one another. When the insulating layer 38 is formed as a double layer or multiple layers, each layer of the insulating layer 38 may include the same material or different materials and may be formed via different processes. Accordingly, it is possible to prevent an electrical short-circuit that may occur when the emissive layer 36 comes in contact with an electrode through which an electric signal is transmitted to the light-emitting element ED. Since the insulating layer 38 includes the emissive layer 36 to protect the outer surface of the light-emitting element ED, it is possible to prevent a decrease in luminous efficiency.

The outer surface of the insulating layer 38 may be subjected to surface treatment. The light-emitting elements ED may be dispersed in an ink, and the ink may be sprayed onto the electrode. In doing so, a surface treatment may be applied to the insulating layer 38 so that it becomes hydrophobic or hydrophilic in order to keep the light-emitting elements ED dispersed in the ink from being aggregated with one another. For example, the outer surface of the insulating layer 38 may be subjected to surface treatment with a material such as stearic acid and 2,3-naphthalene dicarboxylic acid.

The second insulating layer PAS2 may have a length longer than its line width and still may have a structure capable of preventing delamination. According to an embodiment, the second insulating layer PAS2 may cover the light-emitting elements ED between different electrodes RME and may include extended portions extended in the second direction DR2 and a pattern portion connected to the extended portions and having an area larger than the extended portions in the first direction DR1.

Figure 7:
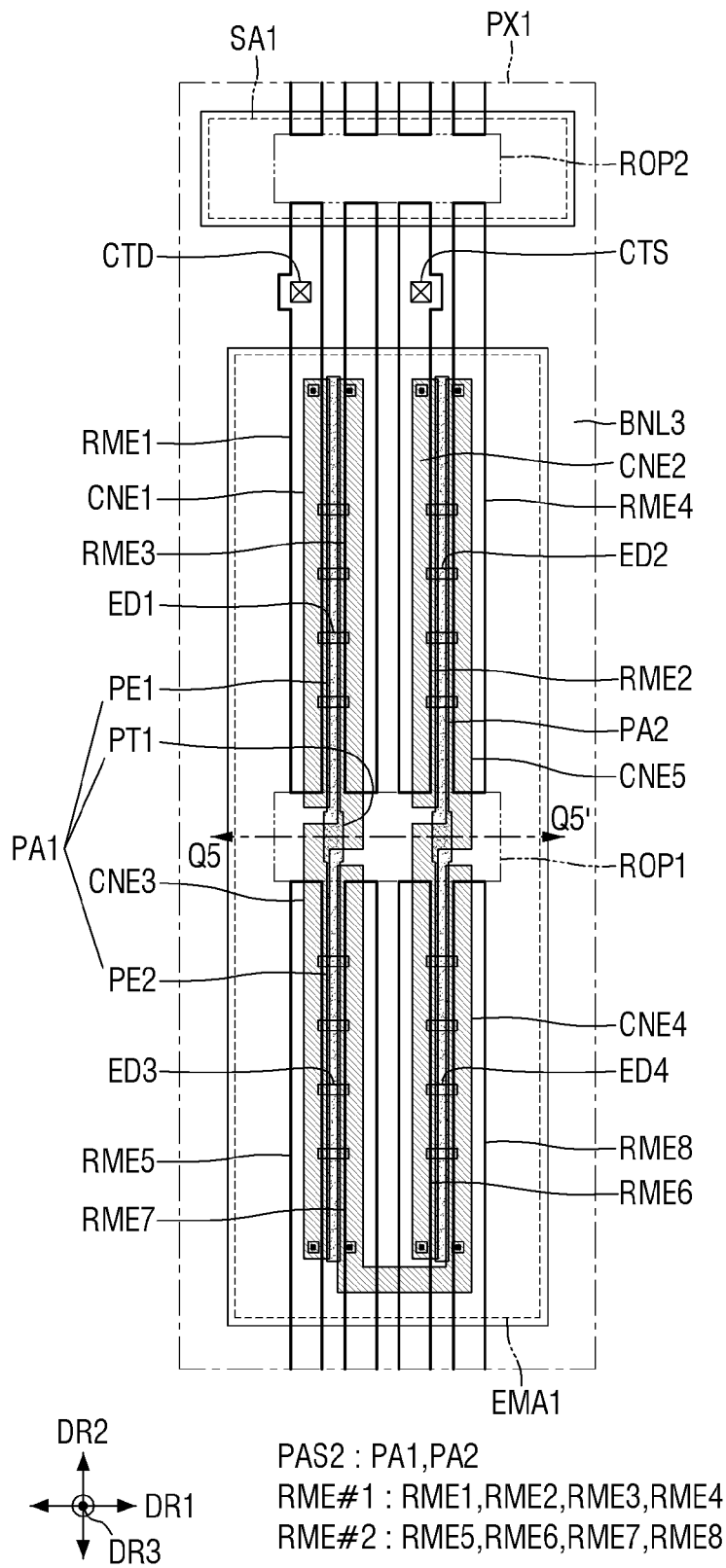
FIG. 7 is a schematic plan view showing a layout of a second insulating layer in a sub-pixel in a display device according to an embodiment.
Figure 8:
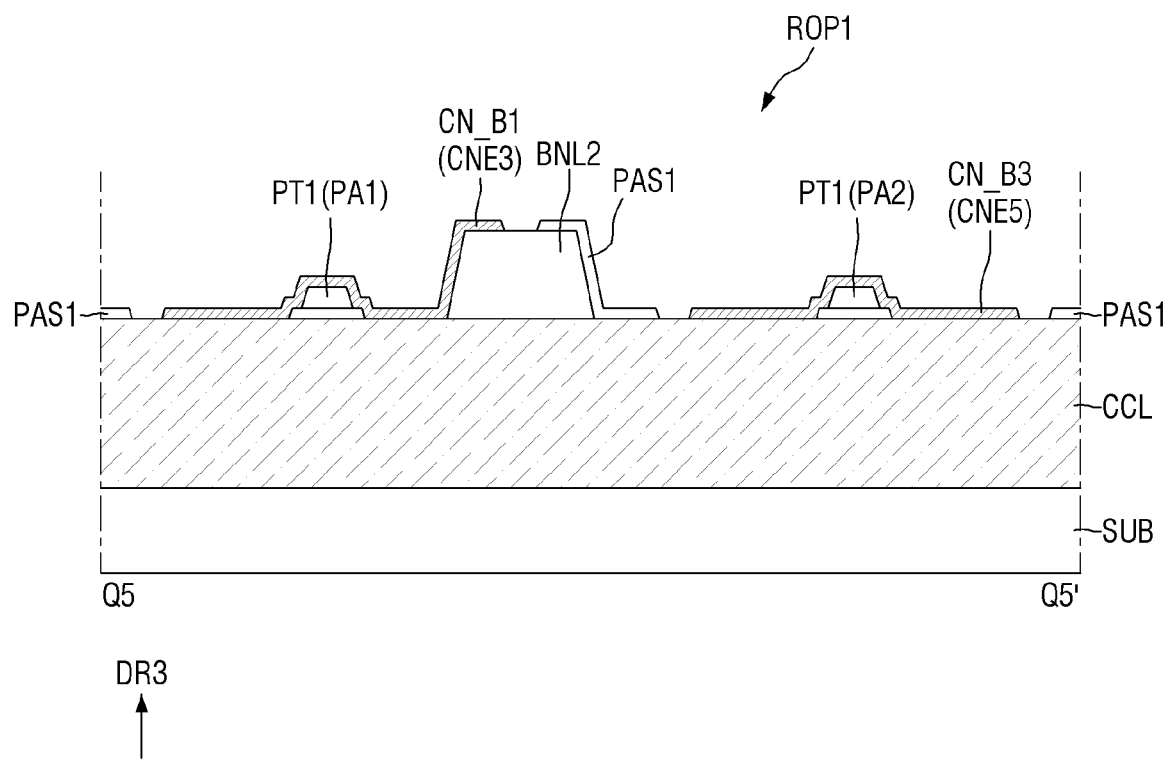
FIG. 8 is a schematic cross-sectional view taken along line Q5-Q5' of FIG. 7.

FIG. 7 is a schematic plan view showing a layout of a second insulating layer in a sub-pixel in a display device according to an embodiment. FIG. 8 is a schematic cross-sectional view taken along line Q5-Q5' of FIG. 7. FIG. 7 shows light-emitting elements ED, electrodes RME and contact electrodes CNE along with the layout of the second insulating layer PAS2 disposed in the first sub-pixel PX1 in a plan view. FIG. 8 shows a cross section of the first pattern portion PT1 of the second insulating layer PAS2 disposed in the first region ROP1 of the emission area EMA.

Referring to FIGS. 7 and 8, in the display device 10 according to an embodiment, the second insulating layer PAS2 may include one or more insulating patterns PA1 and PA2. Each of the insulating patterns PA1 and PA2 may include extended portions PE1 and PE2 and a pattern portion PT1. The second insulating layer PAS2 may be disposed between the electrodes RME spaced apart from each other in the first direction DR1 to cover the light-emitting elements ED. Since the light-emitting elements ED are disposed between the first bank BNL1 and the second bank BNL2 in the emission area EMA of each of the sub-pixels PXn, the second insulating layer PAS2 may include one or more insulating patterns PA1 and PA2 each disposed between the first bank BNL1 and the second bank BNL2.

For example, the first insulating pattern PA1 may be disposed between the first sub-bank BNL_A of the first bank BNL1 and the second bank BNL2, and the second insulating pattern PA2 may be disposed between the second sub-bank BNL_B of the first bank BNL1 and the second bank BNL2. Each of the insulating patterns PA1 and PA2 may include extended portions PE1 and PE2 extended in the second direction DR2 between the electrodes RME. Each of the insulating patterns PA1 and PA2 may include a first extended portion PE1 disposed between the electrodes RME of the first electrode group RME #1, and a second extended portion PE2 disposed between the electrodes RME of the second electrode group RME #2. The first extended portion PE1 of the first insulating pattern PA1 is disposed between the first electrode RME1 and the third electrode RME3, and the second extended portion PE2 of the first insulating pattern PA1 is disposed between the fifth electrode RME5 and the seventh electrode RME7. The first extended portion PE1 of the second insulating pattern PA2 is disposed between the second electrode RME2 and the fourth electrode RME4, and the second extended portion PE2 of the second insulating pattern PA2 is disposed between the sixth electrode RME6 and the eighth electrode RME8. Accordingly, the first insulating pattern PA1 may be disposed to cover the first light-emitting element ED1 disposed on the first electrode RME1 and the third electrode RME3, and the third light-emitting element ED3 disposed on the fifth electrode RME5 and the sixth electrode RME6. The second insulating pattern PA2 may be disposed to cover the second light-emitting element ED2 disposed on the second electrode RME2 and the fourth electrode RME4, and the fourth light-emitting element ED3 disposed on the sixth electrode RME6 and the eighth electrode RME8.

According to an embodiment, the extended portions PE1 and PE2 of the second insulating layer PAS2 may have a width measured in the first direction DR1 less than the length h of the light-emitting elements ED. As described above, the second insulating layer PAS2 disposed on the light-emitting elements ED may have such a width that both ends of the light-emitting elements ED may be exposed. The extended portions PE1 and PE2 of the second insulating layer PAS2 may have a smaller line width than the length extended between the electrodes RME. The width of the extended portions PE1 and PE2 that is measured in the first direction DR1 may be smaller than the length h of the light-emitting elements ED, and may have a relatively large length in the second direction DR2 so as to cover the light-emitting elements ED between the electrodes RME. The insulating patterns PA1 and PA2 of the second insulating layer PAS2 include the extended portions PE1 and PE2 extended in the second direction DR2 between the electrodes RME, and thus may have a generally linear shape in a plan view.

According to an embodiment, the second insulating layer PAS2 may include the first pattern portion PT1 that is connected to the extended portions PE1 and PE2 and has at least a part having a width or length larger than that of the extended portions PE1 and PE2 in the first direction DR1. As the first pattern portion PT1 has a width measured in the first direction DR1 that is greater than the extended portions PE1 and PE2 or includes a shape including a part extended in the first direction DR1, the width of the area occupied by it in the first direction DR1 may be larger than the extended portions PE1 and PE2.

For example, each of the insulating patterns PA1 and PA2 of the second insulating layer PAS2 may include the first pattern portion PT1 that is connected to the first extended portion PE1 and the second extended portion PE2 and has the width larger than that of the extended portions PE1 and PE2. The first pattern portion PT1, the first extended portion PE1, and the second extended portion PE2 may be integral with each other to form each of the insulating patterns PA1 and PA2. The first pattern portion PT1 may be disposed in the first region ROP1 between the first electrode group RME #1 and the second electrode group RME #2. Thus, the first pattern portion PT1 may be disposed in a region between the electrode spaced apart in the second direction DR2. In each sub-pixel PXn, the first insulating pattern PA1 and the second insulating pattern PA2 of the second insulating layer PAS2 may be disposed. The first pattern portion PT1 of each of the insulating patterns PA1 and PA2 may be disposed in the first region ROP1 of the emission area EMA. The number of the first pattern portions PT1 may be equal to the number of insulating patterns PA1 and PA2 in each of the sub-pixels PXn. In the example shown in the drawings, two first patterns PT1 may be disposed in one emission area EMA. However, the embodiments are not limited thereto.

During the process of fabricating the display device 10, the electrodes of the first electrode group RME #1 and the second electrode group RME #2 are formed as continuous electrode lines in the second direction DR2 and then may be separated from each other in the first region ROP1. The process of separating the electrode lines may be carried out by forming the second insulating layer PAS2 and then patterning the first insulating layer PAS1 and the electrode lines. The first insulating layer PAS1 is removed from where the electrode lines are disposed or between the electrodes RME arranged side-by-side in the second direction DR2 to perform a process of patterning the electrode lines. The first insulating layer PAS1 is not removed from the first region ROP1 except between the electrodes RME arranged side-by-side in the second direction DR2. Therefore, the first pattern portion PT1 of the second insulating layer PAS2 may be disposed on the first insulating layer PAS1 disposed in the first region ROP1. The first electrode bridge CN_B1 of the third contact electrode CNE3 and the third electrode bridge CN_B3 of the fifth contact electrode CNE5 may be disposed directly on the first pattern portion PT1.

According to an embodiment, the first pattern portion PT1 may have a width measured in the first direction DR1 that is greater than the width of the extended portions PE1 and PE2 but is smaller than the distance between the electrodes RME spaced apart in the first direction DR1. If the width of the first pattern portion PT1 is too large, it may cover the electrode lines disposed in the first region ROP1 and thus the electrode lines may not be completely separated. Accordingly, the width of the first pattern portion PT1 may be adjusted to the extent that it is larger than the extended portions PE1 and PE2 without covering the electrode lines. However, the embodiments are not limited thereto. Although the first pattern portion PT1 is disposed in the first region ROP1 and has a constant width in the example shown in the drawings, the width may vary depending on the shape and location of the first pattern portion PT1. More detailed descriptions will be given with reference to other embodiments.

During the process of fabricating the display device 10, the extended portions PE1 and PE2 of the second insulating layer PAS2 can fix the alignment positions of the light-emitting elements ED to thereby prevent the light-emitting elements ED from deviating during a subsequent process. As the second insulating layer PAS2 includes the first pattern portion PT1 connected to the extended portions PE1 and PE2, it is possible to prevent the second insulating layer PAS2 from being delaminated during processes after the second insulating layer PAS2 has been formed. The extended portions PE1 and PE2 for fixing the light-emitting elements ED may be easily delaminated since they have a relatively small width compared to their length. In the display device 10 according to the embodiment, the second insulating layer PAS2 further includes the first pattern portion PT1 connected to the extended portions PE1 and PE2 to prevent the second insulating layer PAS2 from delaminating and to prevent the light-emitting elements ED from deviating from their locations.

FIG. 7 shows the embodiment where the second insulating layer PAS2 includes insulating patterns PA1 and PA2, and each of the insulating patterns PA1 and PA2 includes the extended portions PE1 and PE2 and the first pattern portion PT1 having a width larger than that of the extended portions PE1 and PE2. However, the shape and the structure of the first pattern portion PT1 of the second insulating layer PAS2 for preventing delamination of the extended portions PE1 and PE2 may be modified in a variety of ways. Hereinafter, display devices according to a variety of embodiments, especially, the structures of the second insulating layer PAS2 will be described with reference to other drawings.

Figure 9:
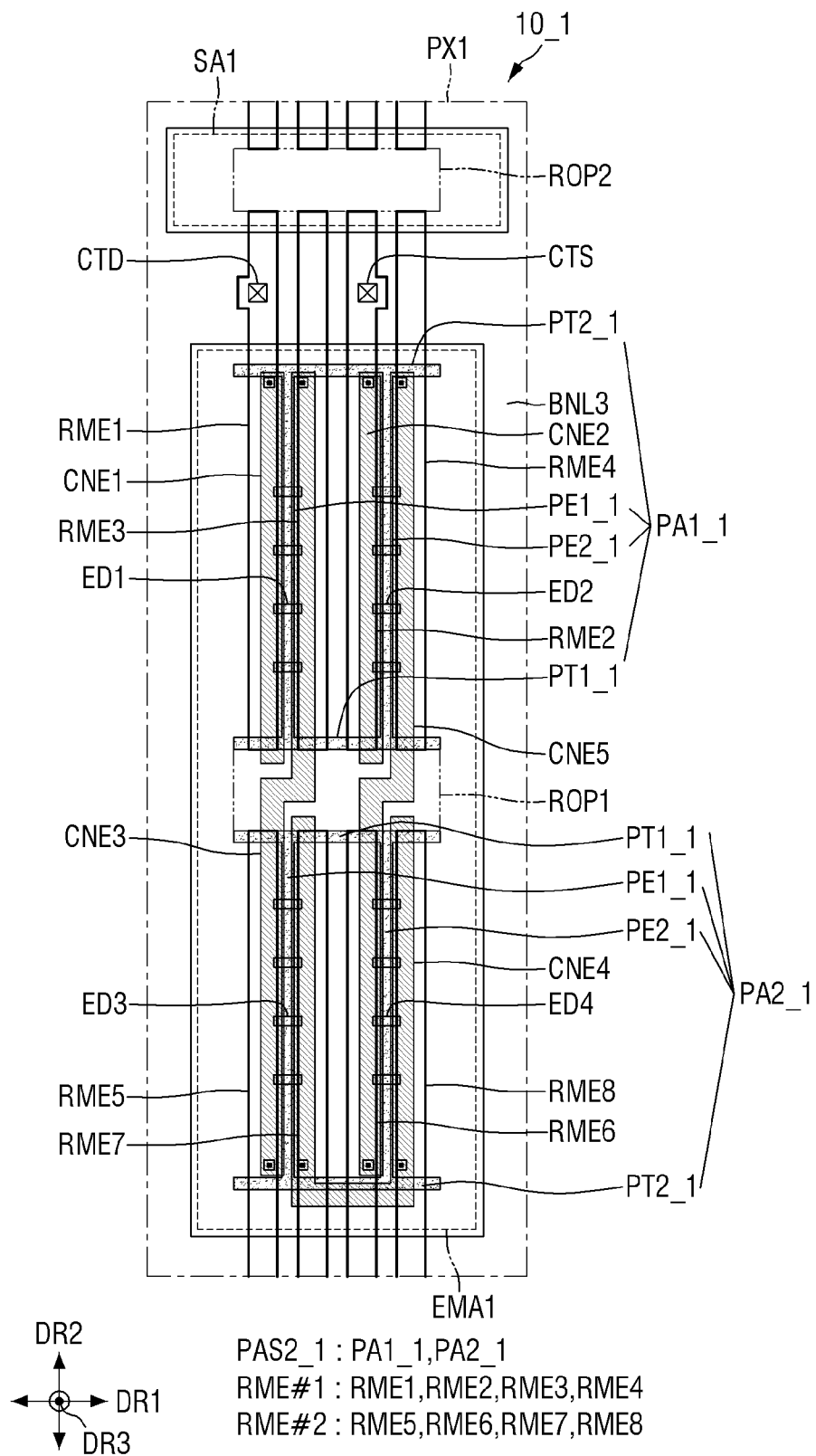
FIG. 9 is a schematic plan view showing a layout of a second insulating layer in a sub-pixel in a display device according to another embodiment.

FIG. 9 is a schematic plan view showing a layout of a second insulating layer in a sub-pixel in a display device according to another embodiment. FIG. 9 shows the relative arrangement of a second insulating layer PAS2_1, light-emitting elements ED, electrodes RME and contact electrodes CNE of the first sub-pixel PX1.

Referring to FIG. 9, in a display device 10_1 according to an embodiment, a second insulating layer PAS2_1 includes insulating patterns PA1_1 and PA2_1 disposed in the first electrode group RME #1 and the second electrode group RME #2, respectively. Each of the insulating patterns PA1_1 and PA2_1 may include one or more pattern portions PT1_1 and PT2_1. The pattern portions PT1_1 and PT2_1 of the second insulating layer PAS2_1 may have the width substantially equal to that of the extended portions PE1_1 and PE2_1, but the length extended in the first direction DR1 may be larger than the extended portions PE1_1 and PE2_1. Each of the insulating patterns PA1_1 and PA2_1 may further include second pattern portion PT2_1 disposed on both sides of the emission area EMA in the second direction DR2, in addition to the first pattern portion PT1_1 disposed at the boundary between the extended portions PE1_1 and PE2_1 covering the light-emitting elements ED and the first region ROP1. This embodiment is different from the embodiment of FIG. 7 in that the insulating patterns PA1_1 and PA2_1 of the second insulating layer PAS2_1 have different shapes and arrangement structures. Hereinafter, the differences in the structure of the second insulating layer PAS2_1 will be described in detail while the redundant descriptions will be omitted.

In the second insulating layer PAS2_1 according to an embodiment, the extended portions PE1_1 and PE2_1 of the first insulating pattern PA1_1 may be disposed between the electrodes RME of the first electrode group RME #1, and the extended portions PE1_1 and PE2_1 of the second insulating pattern PA2_1 may be disposed between the electrodes RME of the second electrode group RME #2. For example, in the first insulating pattern PA1_1, the first extended portion PE1_1 may be disposed between the first electrode RME1 and the third electrode RME3, and the second extended portion PE2_1 may be disposed between the second electrode RME2 and the fourth electrode RME4. The first extended portion PE1_1 of the second insulating pattern PA2 may be disposed between the fifth electrode RME5 and the seventh electrode RME7, and the second extended portion PE2_1 of the second insulating pattern PA2 may be disposed between the sixth electrode RME6 and the eighth electrode RME8. Accordingly, the first insulating pattern PA1_1 may be disposed to cover the first light-emitting elements ED1 and the second light-emitting elements ED2, and the second insulating pattern PA2_1 may be disposed to cover the third light-emitting elements ED3 and the fourth light-emitting elements ED4.

The insulating patterns PA1_1 and PA2_1 include one or more pattern portions PT1_1 and PT2_1 connected to the extended portions PE1_1 and PE2_1. The pattern portions PT1_1 and PT2_1 may include first pattern portions PT1_1 disposed at the boundaries where the electrodes RME of each of the electrode groups RME #1 and RME #2 are in contact with the first region ROP1, and second pattern portions PT2_1 disposed adjacent to the third bank BNL3 on the upper and lower sides of the emission area EMA. The first and second pattern portions PT1_1 and PT2_1 may have the width equal to that of the extended portions PE1_1 and PE2_1, but the length extended in the first direction DR1 may be larger than the extended portions PE1_1 and PE2_1. As described above, the pattern portions PT1_1 and PT2_1 of the second insulating layer PAS2_1 may have a width in the first direction DR1 larger than the extended portions PE1_1 and PE2_1 in order to prevent the extended portions PE1_1 and PE2_1 from being delaminated. According to this embodiment, the pattern portions PT1_1 and PT2_1 have a shape extended in the first direction DR1, thereby preventing delamination of the extended portions PE1_1 and PE2_1.

The first pattern portions PT1_1 may be disposed at the boundaries of the first region ROP1 and may overlap the electrodes RME. The first pattern portions PT1_1 may be disposed on the side where the electrodes RME of the first electrode group RME #1 and the second electrode group RME #2 are spaced apart from and face each other in the second direction DR2. The first pattern portions PT1_1 extended in the first direction DR1 may have such a length that it can overlap all of the four electrodes RME belonging to each of the electrode groups RME #1 and RME #2. The first pattern portion PT1_1 of the first insulating pattern PA1_1 may overlap the first to fourth electrodes RME1, RME2, RME3 and RME4 of the first electrode group RME #1, and the first pattern portion PT1_1 of the second insulating pattern PA2_1 may overlap the fifth to eighth electrodes RME5, RME6, RME7 and RME8 of the second electrode group RME #2. The first pattern portions PT1_1 of the first insulating pattern PA1_1 and the second insulating pattern PA2_1 may be spaced apart from and face each other in the second direction DR2, with the first region ROP1 therebetween. Since the process of separating the electrode lines is performed in the first region ROP1, the first pattern portions PT1_1 are disposed at the boundaries of the first region ROP1 to allow space for separating the electrode lines within the first region ROP1.

The second pattern portions PT2_1 may be disposed on the upper and lower sides of the emission area EMA and disposed adjacent to parts of the third bank BNL3 extended in the first direction DR1. The second pattern portion PT2_1 of the first insulating pattern PA1_1 may be disposed on the upper side of the emission area EMA and adjacent to the sub-area SA. The second pattern portion PT2_1 of the second insulating pattern PA2_1 may be disposed on the lower side of the emission area EMA and adjacent to another sub-pixel PXn. The second pattern portions PT2_1 may be formed in a space between the contact holes CT1 and CT2 formed in the first insulating layer PAS1 and the third bank BNL3, and may partially overlap the electrodes RME and the contact electrodes CNE. Each of the second pattern portions PT2_1 may not overlap with the light-emitting elements ED and may be spaced apart from them in the second direction DR2. Similar to the first pattern portions PT1_1, the second pattern portions PT2_1 extended in the first direction DR1 may have such a length that it can overlap all of the four electrodes RME in each of the electrode groups RME #1 and RME #2. Each of the first pattern portions PT1_1 and the second pattern portions PT2_1 has a length measured in the first direction DR1 greater than the width of the extended portions PE1_1 and PE2_1 in the second direction DR2, so that it is possible to prevent delamination of the second insulating layer PAS2_1.

Although the second insulating layer PAS2 includes the insulating patterns PA1 and PA2 separated from each other according to the above-described embodiment, the embodiments are not limited thereto. The second insulating layer PAS2 may be formed as a single pattern including multiple extended portions PE covering the light-emitting elements ED and one or more pattern portions PT connected thereto.

Figure 10:
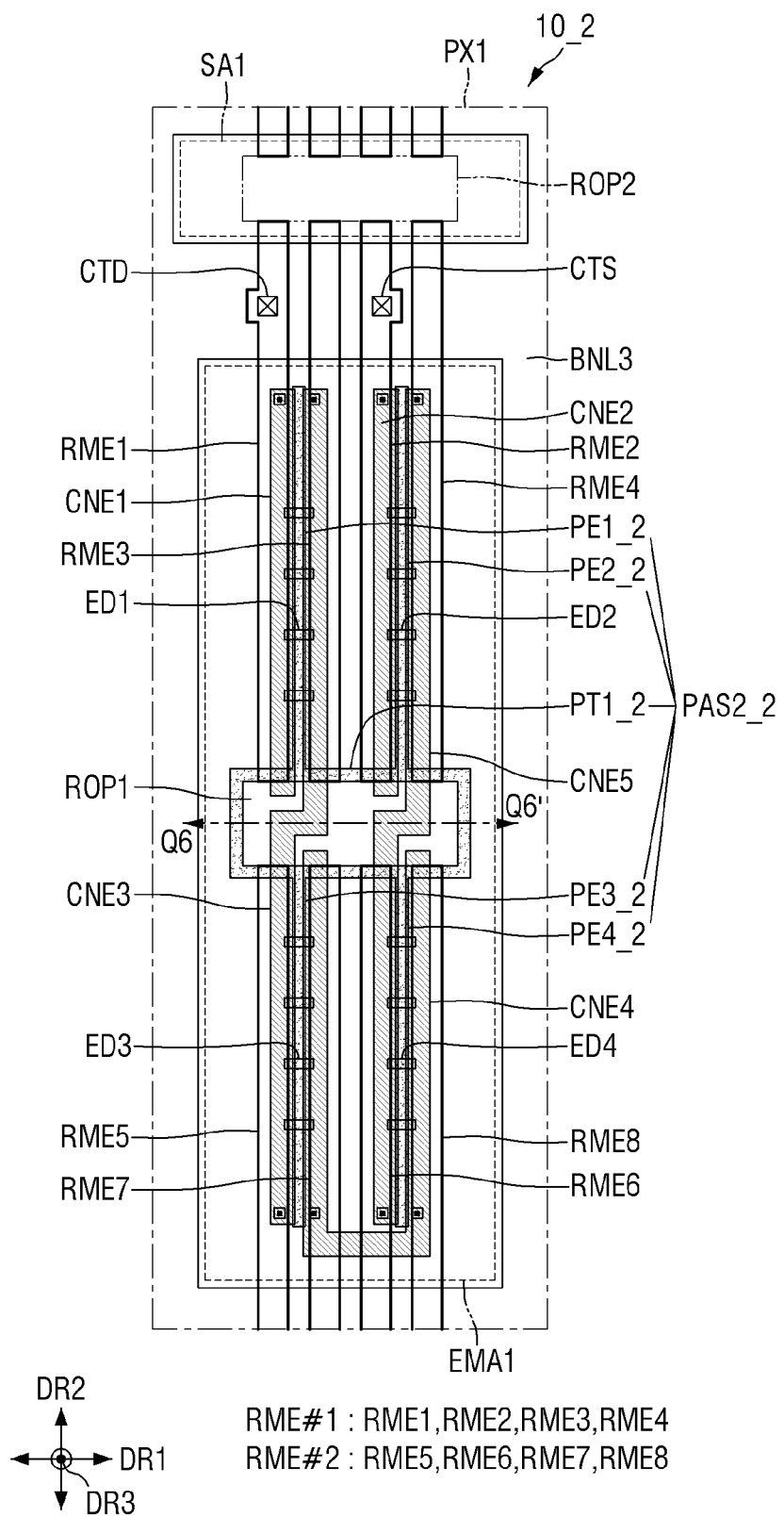
FIG. 10 is a schematic plan view showing a layout of a second insulating layer in a sub-pixel in a display device according to another embodiment.
Figure 11:
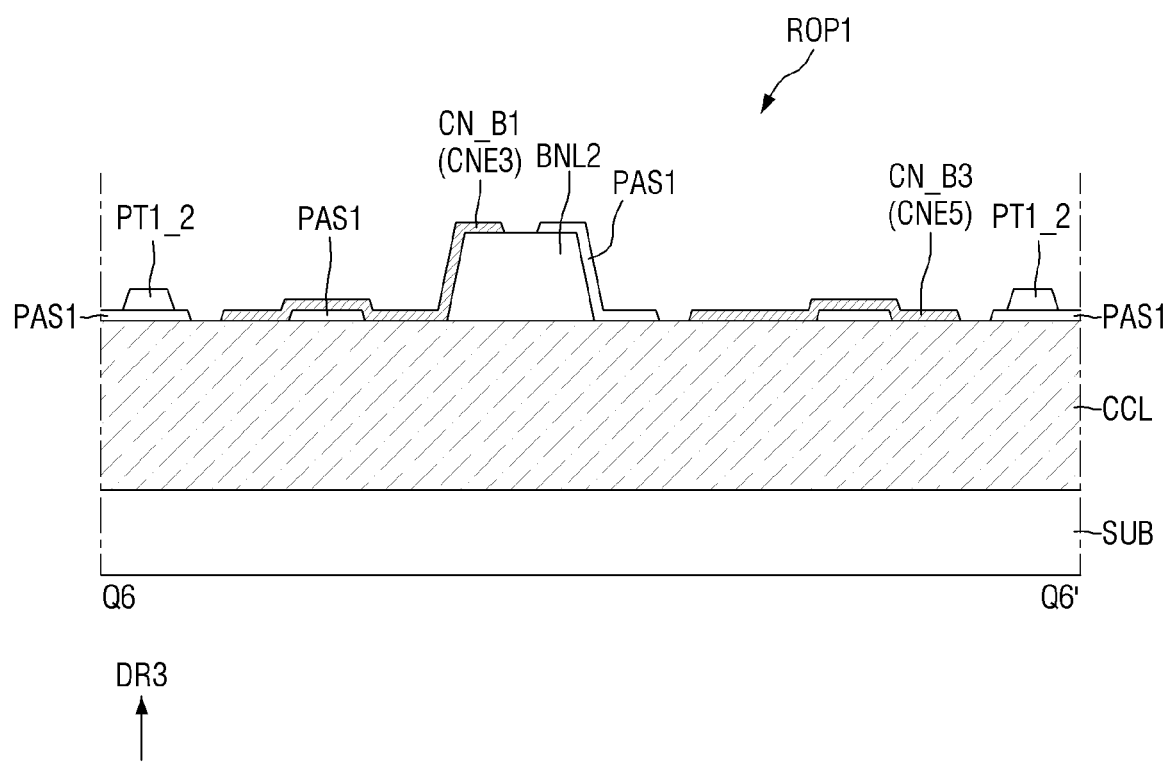
FIG. 11 is a schematic cross-sectional view taken along line Q6-Q6' of FIG. 10.

FIG. 10 is a schematic plan view showing a layout of a second insulating layer in a sub-pixel in a display device according to another embodiment. FIG. 11 is a schematic cross-sectional view taken along line Q6-Q6' of FIG. 10. FIG. 10 shows the relative arrangement of a second insulating layer PAS2_2, and FIG. 11 shows a cross section traversing the first region ROP1 in the first direction DR1.

Referring to FIGS. 10 and 11, in a display device 10_2 according to an embodiment, a second insulating layer PAS2_2 may include multiple extended portions PE1_2, PE2_2, PE3_2 and PE4_2, and a first pattern portion PT1_2 connected thereto. The extended portions PE1_2, PE2_2, PE3_2 and PE4_2 may be extended in the second direction DR2 between the electrodes RME similarly to the embodiment of FIG. 9, while the first pattern portion PT1_2 may be disposed to surround the first region ROP1. This embodiment is different from the embodiments of FIGS. 7 and 9 in that the second insulating layer PAS2_2 is formed as a single continuous pattern, and that the first pattern portion PT1_2 has a different shape. In the following description, descriptions will focus on the difference, and the redundant descriptions will be omitted.

The extended portions PE1_2, PE2_2, PE3_2 and PE4_2 of the second insulating layer PAS2_2 may be disposed in the same manner as described above. For example, the first extended portion PE1_2 and the second extended portion PE2_2 may be disposed between the electrodes RME of the first electrode group RME #1, and the third extended portion PE3_2 and the fourth extended portion PE4_2 may be disposed between the electrodes RME of the second electrode group RME #2. The first to fourth extension parts PE1_2, PE2_2, PE3_2 and PE4_2 may be disposed to overlap the first to fourth light-emitting elements ED1, ED2, ED3 and ED4, respectively.

The first pattern portion PT1_2 may surround the first region ROP1 and may be connected to the first to fourth extended portions PE1_2, PE2_2, PE3_2 and PE4_2. The first pattern portion PT1_2 may have a rectangular shape in a plan view including sides extended in the first direction DR1 and the second direction DR2. Similar to the embodiment of FIG. 9, the width of the pattern portions PT2_1 may be substantially equal to the width of the extended portions PE1_1, PE2_2, PE3_2 and PE4_2, but the length extended in the first direction DR1 may be larger than the length of the extended portions PE1_2, PE2_2, PE3_2 and PE4_2. The parts of the first pattern portion PT1_2 extended in the first direction DR1 may be disposed at the boundaries of the first region ROP1 so that they overlaps the electrodes RME, and the parts thereof extended in the second direction DR2 may connect the parts extended in the first direction DR1 with each other. The first pattern portion PT1_2 is disposed to surround the first region ROP1, so that it can prevent delamination of the extended portions PE1_2, PE2_2, PE3_2 and PE4_2 and may also ensure there is space in the first region ROP1 where the electrode lines may be separated.

Figure 12:
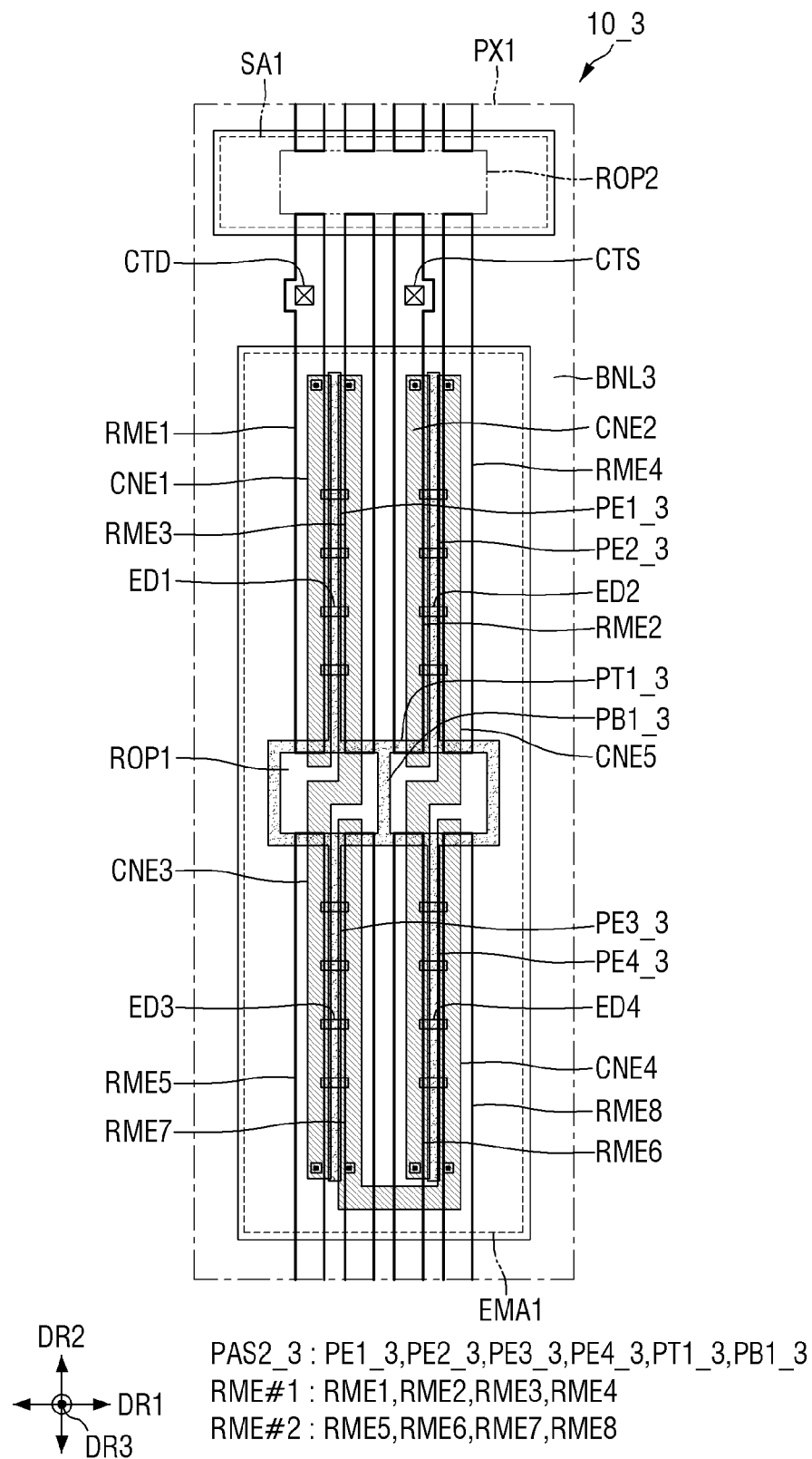
FIG. 12 is a schematic plan view showing a layout of a second insulating layer in a sub-pixel in a display device according to yet another embodiment.

FIG. 12 is a schematic plan view showing a layout of a second insulating layer in a sub-pixel in a display device according to another embodiment.

Referring to FIG. 12, in a display device 10_3 according to an embodiment, a second insulating layer PAS2_3 may include a first pattern portion PT1_3 surrounding the first region ROP1, and a first connection bridge PB1_3 crossing the center of the first pattern portion PT1_3. The first connection bridge PB1_3 may be disposed between extended parts of the second and the sixth electrodes RME2 and RME6, and extended parts of the third and the seventh electrodes RME3 and RME7. The first connection bridge PB1_3 may be extended in the second direction DR2 to cross the center of the first pattern portion PT1_3 and may be integrated with the first pattern portion PT1_3. The first connection bridge PB1_3 may connect a center of a part of the first pattern portion PT1_3 extended in the first direction (on the upper side of ROP1), to the center of another part of the first pattern portion PT1_3 extended in the first direction (on the lower side of ROP1). The first connection bridge PB1_3 can ensure there is space where the electrode lines may be separated and can increase the effect of preventing the delamination by the first pattern portion PT1_3. This embodiment is different from the embodiment of FIG. 10 in that the second insulating layer PAS2_3 further includes the first connection bridge PB1_3 connected to the first pattern portion PT1_3.

Figure 13:
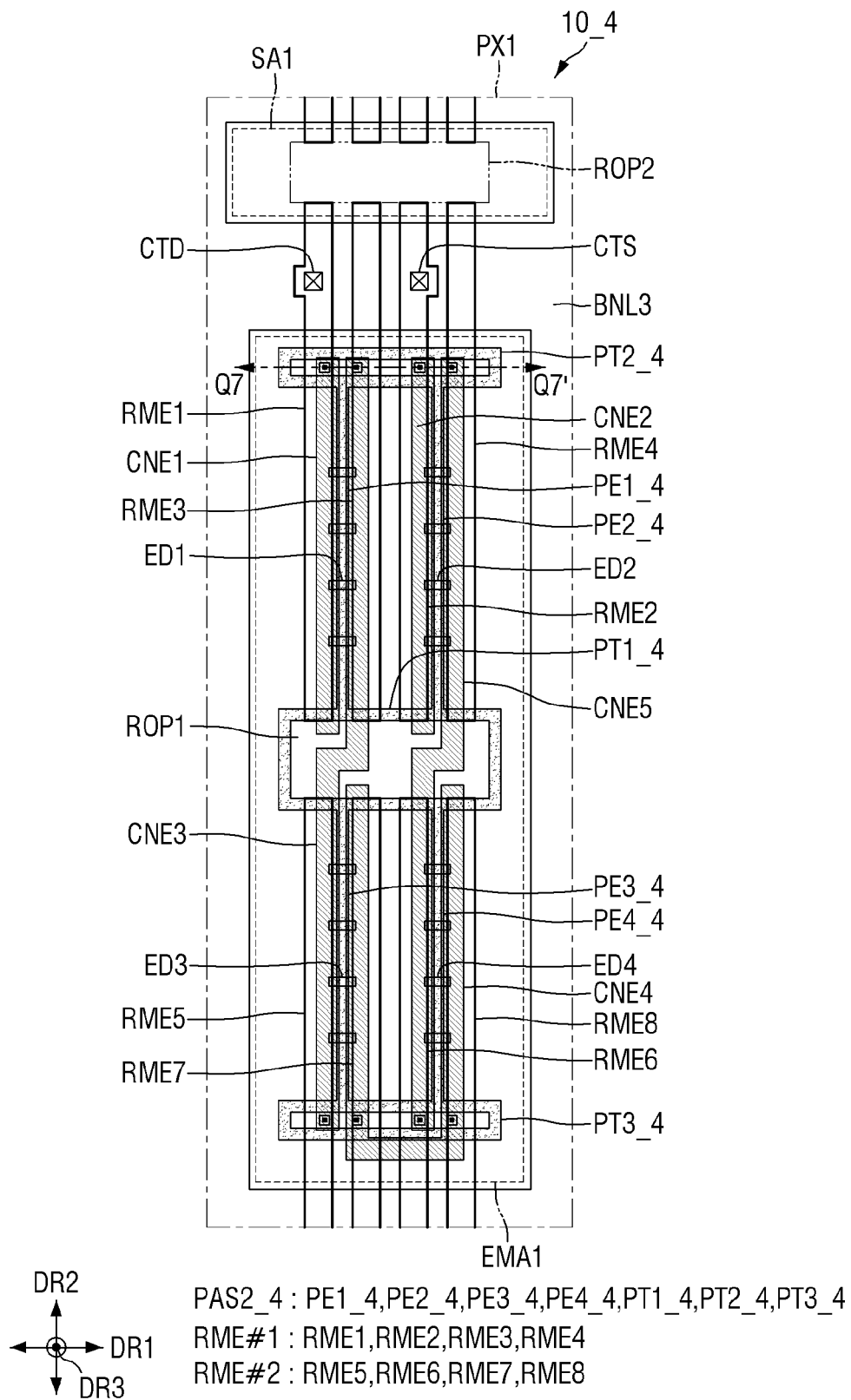
FIG. 13 is a schematic plan view showing a layout of a second insulating layer in a sub-pixel in a display device according to another embodiment.
Figure 14:
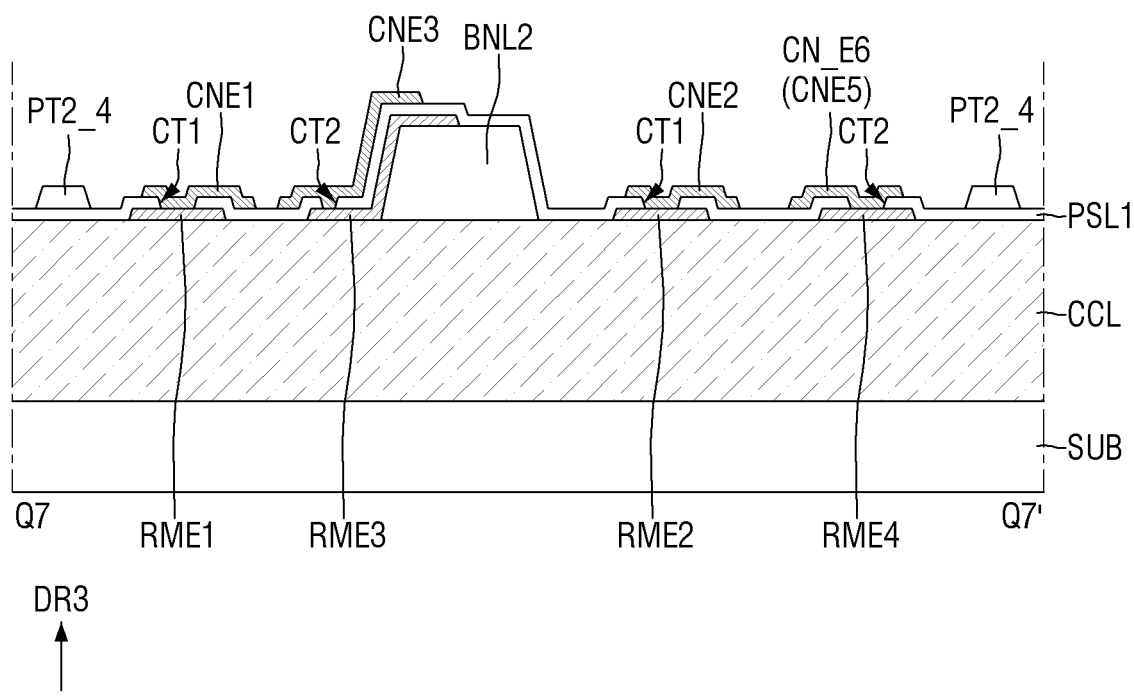
FIG. 14 is a schematic cross-sectional view taken along line Q7-Q7' of FIG. 13.

FIG. 13 is a schematic plan view showing a layout of a second insulating layer in a sub-pixel in a display device according to another embodiment. FIG. 14 is a schematic cross-sectional view taken along line Q7-QT of FIG. 13. FIG. 13 shows relative arrangement of a second insulating layer PAS2_4, and FIG. 14 shows a cross section traversing the contact holes CT1 and CT2 formed in the first insulating layer PAS1 in the first direction DR1.

Referring to FIGS. 13 and 14, in a display device 10_4 according to an embodiment, a second insulating layer PAS2_4 may further include a second pattern portion PT2_4 and a third pattern portion PT3_4 surrounding regions in which the contact holes CT1 and CT2 are formed where the contact electrodes CNE are in contact with the electrodes RME, in addition to a first pattern portion PT1_4. This embodiment is different from the embodiment of FIG. 12 in that the second insulating layer PAS2_4 further includes the second pattern portion PT2_4 and the third pattern portion PT3_4.

Similar to the first pattern portion PT1_4, the second pattern portion PT2_4 and the third pattern portion PT3_4 may include parts extended in the first direction DR1 and the second direction DR2. The length of the parts of the second pattern portion PT2_4 and the third pattern portion PT3_4 extended in the first direction DR1 may be equal to the length of the first pattern portion PT1_4 in the first direction DR1. The length of the parts thereof extended in the second direction DR2 may be less than that of the first pattern portion PT1_4. The second pattern portion PT2_4 may be disposed to surround the contact holes CT1 and CT2 formed on the electrodes RME of the first electrode group RME #1, and the third pattern portion PT3_4 may be disposed to surround the contact holes CT1 and CT2 formed on the electrodes RME of the second electrode group RME #2. The second pattern portion PT2_4 may be disposed on the upper side of the emission area EMA and spaced apart from the first pattern portion PT1_4 in the second direction DR2, and the third pattern portion PT3_4 may be disposed on the lower side of the emission area EMA and spaced apart from the first pattern portion PT1_4 in the opposite direction of the second direction DR2. The second pattern portion PT2_4 and the third pattern portion PT3_4 may be spaced apart from each other so that they do not overlap with the light-emitting elements ED disposed on the first electrode group RME #1 and the second electrode group RME #2. Specifically, the second pattern portion PT2_4 may be connected to the extended portions PE1_4 and PE2_4 while the third pattern portion PT3_4 may be connected to the extended portions PE3_4 and PE4_4, and they may be spaced apart from the first pattern portion PT1_4 in the second direction DR2.

The second pattern portion PT2_4 and the third pattern portion PT3_4 may not cover the contact holes CT1 and CT2 so that the contact electrodes CNE formed during a subsequent process can be in contact with the electrodes RME through the contact holes CT1 and CT2. As the second insulating layer PAS2_4 further includes the second pattern portion PT2_4 and the third pattern portion PT3_4 in addition to the first pattern portion PT1_4, it is possible to further increase the effect of preventing delamination of the extended portions PE1_4, PE2_4, PE3_4 and PE4_4.

Figure 15:
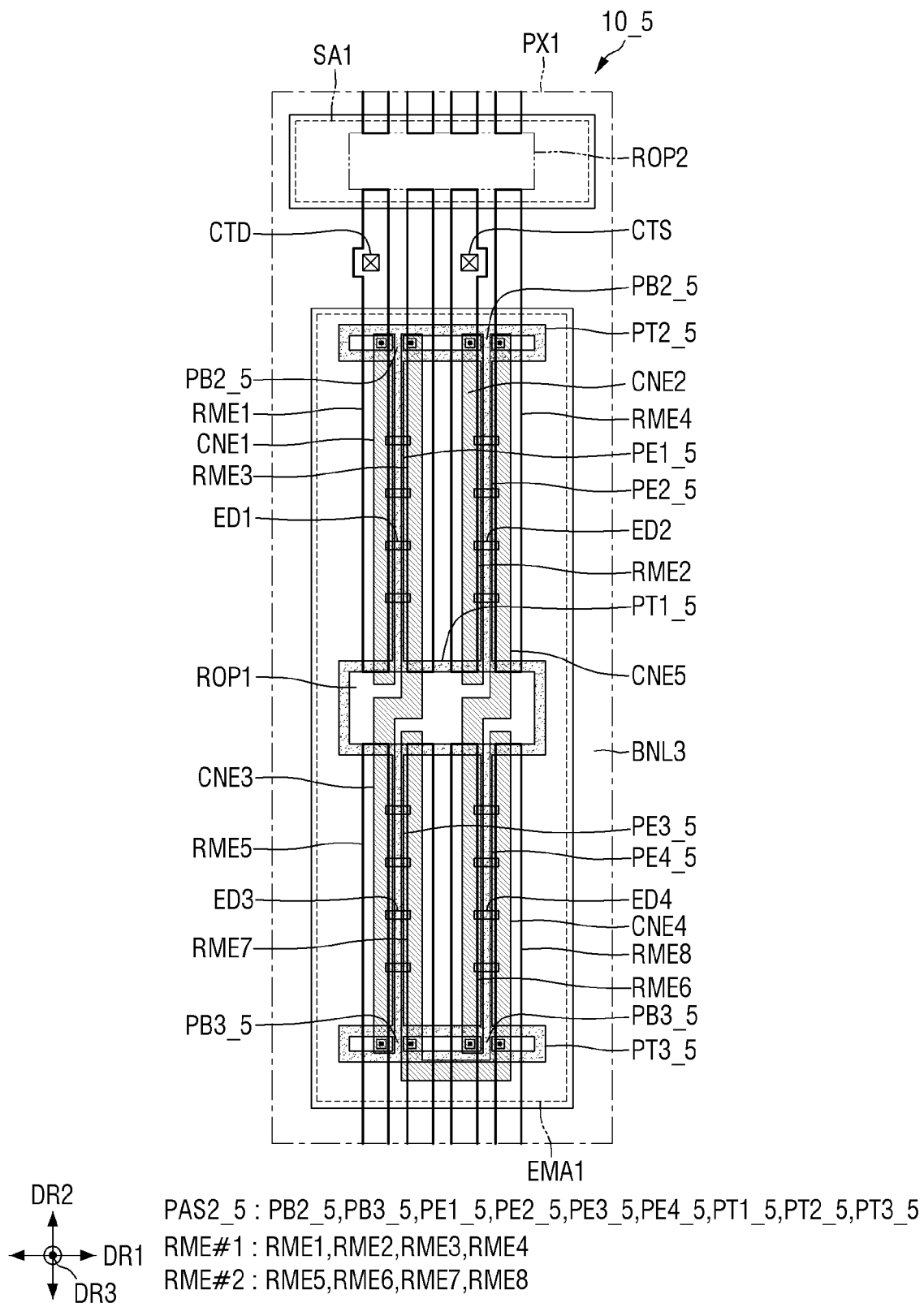
FIG. 15 is a schematic plan view showing a layout of a second insulating layer in a sub-pixel in a display device according to yet another embodiment.

FIG. 15 is a schematic plan view showing a layout of a second insulating layer in a sub-pixel in a display device according to another embodiment.

Referring to FIG. 15, in a display device 10_5 according to an embodiment, a second insulating layer PAS2_5 may further include multiple connection bridges disposed in regions surrounded by a second pattern portion PT2_5 and a third pattern portion PT3_5, respectively. The second pattern portion PT2_5 may be disposed so as to surround the contact holes CT1 and CT2 formed on the first electrode group RME #1, and the second connection bridges PB2_5 may be disposed between the electrodes RME to connect the parts of the second pattern portion PT2_5 extended in the first direction DR1 with one another. The second connection bridges PB2_5 may be arranged in parallel with the first extended portion PE1_5 and the second extended portion PE2_5, and may be disposed between the first electrode RME1 and the third electrode RME3, and between the second electrode RME2 and the fourth electrodes RME4.

The third pattern portion PT3_5 may be disposed so as to surround the contact holes CT1 and CT2 formed on the second electrode group RME #2, and the third connection bridges PB3_5 may be disposed between the electrodes RME to connect the parts of the third pattern portion PT3_5 extended in the first direction DR1 with one another. The third connection bridges PB3_5 may be arranged in parallel with the third extended portion PE3_5 and the fourth extended portion PE4_5, and may be disposed between the fifth electrode RME5 and the seventh electrode RME7, and between the sixth electrode RME6 and the eighth electrodes RME8. As the second insulating layer PAS2_5 further includes the connection bridges PB2_5 and PB3_5 disposed in the regions surrounded by the second pattern portion PT2_5 and the third pattern portion PT3_5, respectively, so that it is possible to prevent the second insulating layer PAS2_5 from being delaminated.

Figure 16:
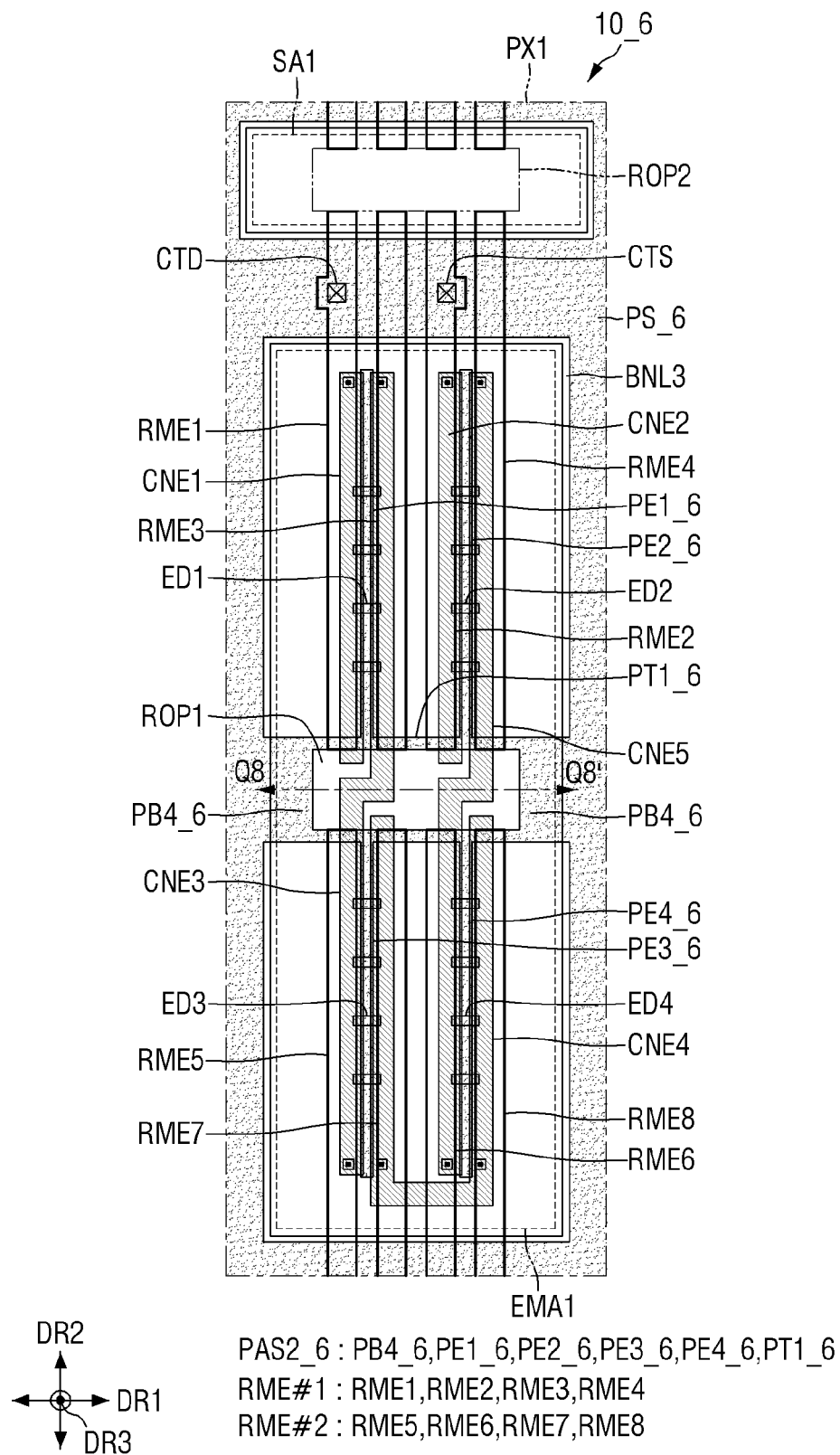
FIG. 16 is a schematic plan view showing a layout of a second insulating layer in a sub-pixel in a display device according to another embodiment.
Figure 17:
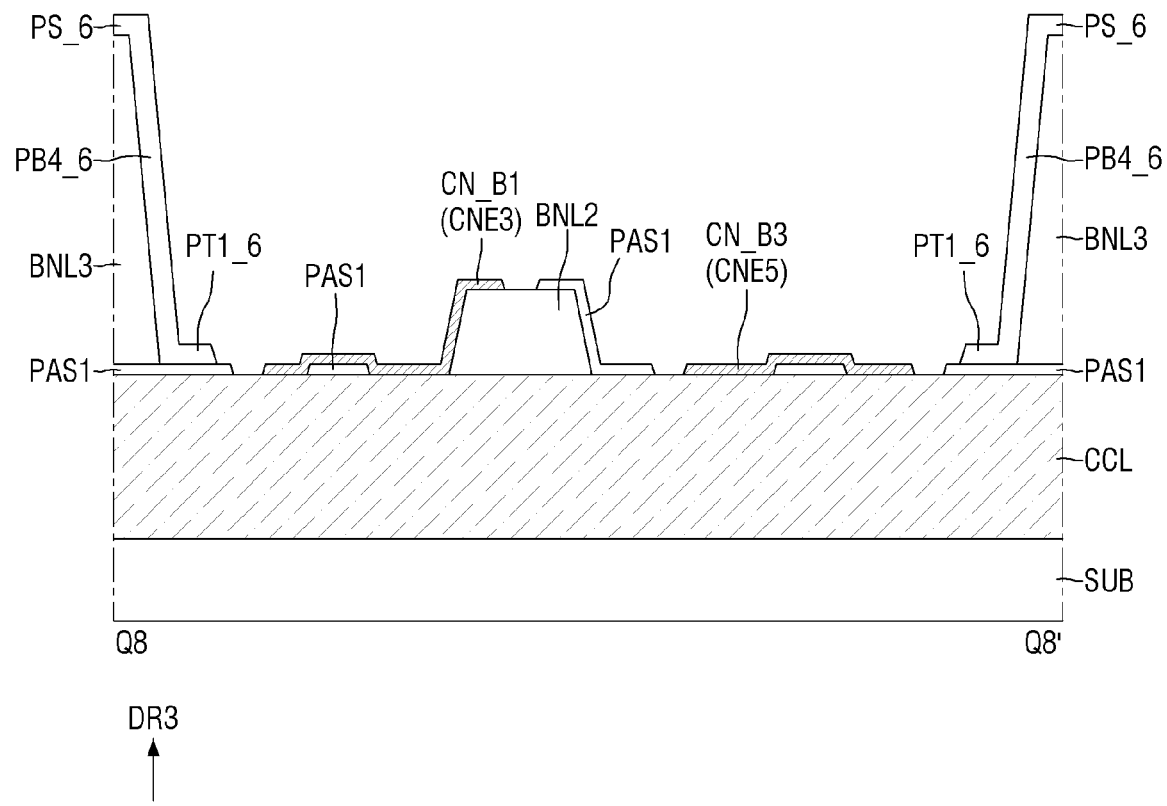
FIG. 17 is a schematic cross-sectional view taken along line Q8-Q8' of FIG. 16.

FIG. 16 is a schematic plan view showing a layout of a second insulating layer in a sub-pixel in a display device according to another embodiment. FIG. 17 is a schematic cross-sectional view taken along line Q8-Q8' of FIG. 16.

Referring to FIGS. 16 and 17, in a display device 10_6 according to an embodiment, a second insulating layer PAS2_6 may further include an upper layer PS_6 disposed on a third bank BNL3, and a fourth connection bridge PB4_6 connecting the upper layer PS_6 to a first pattern portion PT1_6. The second insulating layer PAS2_6 according to this embodiment includes extended portions PE1_6, PE2_6, PE3_6 and PE4_6 and a first pattern portion PT1_6, similar to the embodiment of FIG. 12, and it may further include the upper layer PS_6 disposed on the third bank BNL3, and the fourth connection bridge PB4_6 connecting the upper layer PS_6 to the first pattern portion PT1_6. In the following description, descriptions will focus on the difference, and the redundant descriptions will be omitted.

The second insulating layer PAS2_6 may be formed via a process of disposing it entirely on the third bank BNL3 and the first insulating layer PAS1, and exposing both ends of the light-emitting elements ED and a part of the first region ROP1. Accordingly, the second insulating layer PAS2_6 may include a part disposed on the third bank BNL3 and a part surrounding the first region ROP1, and the upper layer PS_6 formed with a large width and the first pattern portion PT1_6 may be connected to each other in order to prevent delamination of the second insulating layer PAS2_6 disposed in the emission area EMA.

The upper layer PS_6 of the second insulating layer PAS2_6 may be disposed in the same shape as the third bank BNL3 in a plan view. The upper layer PS_6 may be extended in the first direction DR1 and the second direction DR2 to be disposed in a lattice pattern, and may surrounded the emission area EMA and the sub-area SA, in addition to the boundary of each of the sub-pixels PXn. The width of the upper layer PS_6 may be larger than the widths of the extended portions PE1_6, PE2_6, PE3_6 and PE4_6 and the first pattern portion PT1_6.

The fourth connection bridge PB4_6 may be connected to the first pattern portion PT1_6 and the upper layer PS_6 disposed at the boundaries of the first region ROP1. The fourth connection bridge PB4_6 may be formed on both sides of the first region ROP1 in the first direction DR1 in the emission area EMA, and the width measured in the second direction DR2 may be equal to the length of the first pattern portion PT1_6 in the second direction DR2. In other words, the fourth connection bridge PB4_6 may be actually a part expanded from both sides of the first pattern portion PT1_6 in the first direction DR1.

In the display device 10_6 according to an embodiment, a second insulating layer PAS2_6 is also disposed on the third bank BNL3, and the extended portions PE1_6, PE2_6, PE3_6 and PE4_6 and the pattern portion PT1_6 disposed in the emission area EMA are connected to the upper layer PS_6 on the third bank BNL3, so that it is possible to further increased the effect of preventing the delamination.

While the invention has been illustrated and described with reference to the embodiments thereof, it will be apparent to those of ordinary skill in the art that various changes in form and detail may be formed thereto without departing from the spirit and scope of the invention.

What is claimed is:
1. A display device comprising:
    a plurality of electrodes spaced apart from one another in a first direction and in a second direction intersecting the first direction, each of the plurality of electrodes having a shape extending in the second direction;
    a first insulating layer disposed on the plurality of electrodes;
    a plurality of light-emitting elements disposed on the first insulating layer, each of the plurality of light-emitting elements including ends disposed on the plurality of electrodes spaced apart from one another in the first direction; and
    a second insulating layer at least partially disposed on the plurality of light-emitting elements,
    wherein the second insulating layer comprises:
        a plurality of extended portions extending in the second direction; and
        at least one pattern portion connected between the plurality of extended portions in the second direction, the at least one pattern portion comprising a part having a width greater than a width of each of the plurality of extended portions in the first direction.
2. The display device of claim 1, wherein
    a width of each of the plurality of extended portions is smaller than a length of each of the plurality of light-emitting elements in the first direction,
    the at least one pattern portion is disposed in a first region between the plurality of electrodes spaced apart in the second direction, and
    a width of the at least one pattern portion is smaller than a distance between the plurality of electrodes spaced apart from each other in the first direction.
3. The display device of claim 1, wherein the at least one pattern portion has a shape extending in the first direction and is disposed on a side of the plurality of electrodes where the plurality of electrodes spaced apart from one another in the second direction face each other.
4. The display device of claim 1, wherein
    the at least one pattern portion comprises a first pattern portion surrounding a first region between the plurality of electrodes spaced apart from each other in the second direction, and
    a length of a part of the first pattern portion extended in the first direction is greater than a width of each of the plurality of extended portions in the first direction.
5. A display device comprising:
    a plurality of electrodes spaced apart from one another in a first direction and in a second direction intersecting the first direction, each of the plurality of electrodes having a shape extending in the second direction;
    a first insulating layer disposed on the plurality of electrodes;
    a plurality of light-emitting elements disposed on the first insulating layer, each of the plurality of light-emitting elements including ends disposed on the plurality of electrodes spaced apart from one another in the first direction; and a second insulating layer at least partially disposed on the plurality of light-emitting elements, wherein the second insulating layer comprises:

a plurality of extended portions extending in the second direction; and at least one pattern portion connected to the plurality of extended portions, the at least one pattern portion comprising a part having a width greater than a width of each of the plurality of extended portions in the first direction, wherein the at least one pattern portion comprises a first pattern portion surrounding a first region between the plurality of electrodes spaced apart from each other in the second direction, a length of a part of the first pattern portion extended in the first direction is greater than a width of each of the plurality of extended portions in the first direction, and the first pattern portion further comprises:

a first connection bridge connecting a center of a part of the first pattern portion extended in the first direction to a center of another part of the first pattern portion extended in the first direction.

6. The display device of claim 4, wherein the first insulating layer comprises a plurality of contact holes that are spaced apart from the plurality of light-emitting elements in the second direction and expose parts of the plurality of electrodes, and the at least one pattern portion comprises a second pattern portion that surrounds an area in which the plurality of contact holes are formed and does not overlap the plurality of contact holes.

7. A display device comprising:

a plurality of electrodes spaced apart from one another in a first direction and in a second direction intersecting the first direction, each of the plurality of electrodes having a shape extending in the second direction;

a first insulating layer disposed on the plurality of electrodes;

a plurality of light-emitting elements disposed on the first insulating layer, each of the plurality of light-emitting elements including ends disposed on the plurality of electrodes spaced apart from one another in the first direction; and a second insulating layer at least partially disposed on the plurality of light-emitting elements, wherein the second insulating layer comprises:

a plurality of extended portions extending in the second direction; and at least one pattern portion connected to the plurality of extended portions, the at least one pattern portion comprising a part having a width greater than a width of each of the plurality of extended portions in the first direction, wherein the at least one pattern portion comprises a first pattern portion surrounding a first region between the plurality of electrodes spaced apart from each other in the second direction, a length of a part of the first pattern portion extended in the first direction is greater than a width of each of the plurality of extended portions in the first direction, the first insulating layer comprises a plurality of contact holes that are spaced apart from the plurality of light-emitting elements in the second direction and expose parts of the plurality of electrodes, the at least one pattern portion comprises a second pattern portion that surrounds an area in which the plurality of contact holes are formed and does not overlap the plurality of contact holes, the second pattern portion comprises second connection bridges disposed between the plurality of contact holes, each of the second connection bridges connecting a part of the second pattern portion extending in the first direction to another part of the second pattern portion extending in the first direction, and the second connection bridges are arranged in parallel with the plurality of extended portions.

8. The display device of claim 4, further comprising:

an emission area where the plurality of electrodes is disposed;

a sub-area located on a side of the emission area in the second direction; and a bank surrounding the emission area and the sub-area, wherein the second insulating layer further comprises:

an upper layer disposed on the bank; and a connection bridge connecting the upper layer to the first pattern portion.

9. The display device of claim 1, wherein the plurality of electrodes comprise:

a first electrode;

a second electrode spaced apart from the first electrode in the first direction;

a third electrode disposed between the first electrode and the second electrode; and a fourth electrode spaced apart from the second electrode in the first direction, the plurality of light-emitting elements comprise:

a first light-emitting element including ends disposed on the first electrode and the third electrode, respectively; and a second light-emitting element including ends disposed on the second electrode and the fourth electrode, respectively, and the plurality of extended portions of the second insulating layer comprise:

a first extended portion that overlaps the first light-emitting element; and a second extended portion that overlaps the second light-emitting element.

10. The display device of claim 9, wherein the plurality of electrodes further comprise:

a fifth electrode spaced apart from the first electrode in the second direction;

a sixth electrode spaced apart from the second electrode in the second direction;

a seventh electrode spaced apart from the third electrode in the second direction; and an eighth electrode spaced apart from the fourth electrode in the second direction, the plurality of light-emitting elements further comprise:

a third light-emitting element including ends disposed on the fifth electrode and the seventh electrode, respectively; and a fourth light-emitting element including ends disposed on the sixth electrode and the eighth electrode, respectively, and the plurality of extended portions of the second insulating layer further comprise:

a third extended portion that overlaps the third light-emitting element, and a fourth extended portion that overlaps the fourth light-emitting element.

11. The display device of claim 10, wherein the at least one pattern portion comprises a first pattern portion surrounding a first region between the plurality of electrodes spaced apart from each other in the second direction and connected to the first to fourth extended portions.

12. The display device of claim 11, wherein
the at least one pattern portion further comprises:
   a second pattern portion connected to the first extended portion and the second extended portion and spaced apart from the first pattern portion in the second direction; and
   a third pattern portion connected to the third extended portion and the fourth extended portion and spaced apart from the first pattern portion in the second direction, and
the second pattern portion and the third pattern portion do not overlap the plurality of light-emitting elements.

13. The display device of claim 10, further comprising:
a first contact electrode disposed on the first electrode and contacting the first light-emitting element;
a second contact electrode disposed on the second electrode and contacting the second light-emitting element;
a third contact electrode disposed on the third electrode and the fifth electrode, and contacting the first light-emitting element and the third light-emitting element;
a fourth contact electrode disposed on the seventh electrode and the eighth electrode, and contacting the third light-emitting element and the fourth light-emitting element; and
a fifth contact electrode disposed on the fourth electrode and the sixth electrode, and contacting the second light-emitting element and the fourth light-emitting element.

14. The display device of claim 13, wherein
at least a part of each of the first, second, third, fourth, and fifth contact electrodes is disposed on the second insulating layer.

15. A display device comprising:
a first electrode group comprising a plurality of electrodes spaced apart from one another in a first direction and extending in a second direction intersecting the first direction;
a second electrode group comprising a plurality of electrodes spaced apart from the first electrode group in the second direction and spaced apart from one another in the first direction;
a first insulating layer disposed on the plurality of electrodes;
a plurality of light-emitting elements disposed on the plurality of electrodes spaced apart in the first direction;
a second insulating layer at least partially disposed on the light-emitting elements; and
a plurality of contact electrodes that contact at least one of the plurality of electrodes and at least one of the plurality of light-emitting elements,
wherein the second insulating layer comprises:
   a plurality of extended portions overlapping the light-emitting elements and extending in the second direction; and
   a pattern portion connected between the plurality of extended portions in the second direction and comprising a part having a width greater than a width of each of the plurality of extended portions in the first direction.

16. The display device of claim 15, wherein
the pattern portion is disposed between the first electrode group and the second electrode group, and
a width of the pattern portion is larger than a width of each of the plurality of extended portions in the first direction, and is smaller than a distance between the plurality of electrodes spaced apart from one another in the first direction.

17. The display device of claim 15, wherein the pattern portion has a shape extending in the first direction and is disposed on a side of the plurality of electrodes where the plurality of electrodes spaced apart from one another in the second direction face each other.

18. The display device of claim 15, wherein the pattern portion comprises a first pattern portion connected to the plurality of extended portions and surrounding a first region between the first electrode group and the second electrode group.

19. The display device of claim 18, wherein
the first insulating layer comprises a plurality of contact holes that are spaced apart from the plurality of light-emitting elements in the second direction, and expose parts of the plurality of electrodes of the first electrode group and the second electrode group, and
the pattern portion further comprises a second pattern portion connected to the plurality of extended portions and surrounding an area in which the plurality of contact holes are disposed.

20. The display device of claim 15, wherein the plurality of contact electrodes comprise:
a plurality of first type contact electrodes disposed on one of the electrodes; and a plurality of second type contact electrodes disposed over two or more of the electrodes.

* * * * *